United States Patent
Yamazaki et al.

(10) Patent No.: US 6,977,393 B2
(45) Date of Patent: Dec. 20, 2005

(54) ELECTRO-OPTICAL DEVICE AND MANUFACTURING METHOD THEREOF

(75) Inventors: Shunpei Yamazaki, Tokyo (JP); Hisashi Ohtani, Kanagawa (JP); Setsuo Nakajima, Kanagawa (JP)

(73) Assignee: Semiconductor Energy Laboratory Co., Ltd., (JP)

( * ) Notice: Subject to any disclaimer, the term of this patent is extended or adjusted under 35 U.S.C. 154(b) by 0 days.

(21) Appl. No.: 10/919,650

(22) Filed: Aug. 17, 2004

(65) Prior Publication Data

US 2005/0017242 A1 Jan. 27, 2005

Related U.S. Application Data

(63) Continuation of application No. 10/262,261, filed on Oct. 1, 2002, now Pat. No. 6,791,112, which is a continuation of application No. 09/441,026, filed on Nov. 16, 1999, now Pat. No. 6,512,271.

(30) Foreign Application Priority Data

Nov. 16, 1998 (JP) ................................. 10-325719

(51) Int. Cl.⁷ ............................................. H01L 31/036
(52) U.S. Cl. .................... 257/59; 257/72; 257/413; 257/351
(58) Field of Search ................. 257/350, 351, 257/59, 72, 412, 413

(56) References Cited

U.S. PATENT DOCUMENTS

| | | | |
|---|---|---|---|
| 5,015,599 A | 5/1991 | Verhaar | 437/44 |
| 5,247,190 A | 9/1993 | Friend et al. | 257/40 |
| 5,323,042 A | 6/1994 | Matsumoto | 257/350 |
| 5,399,502 A | 3/1995 | Friend et al. | 437/1 |
| 5,643,826 A | 7/1997 | Ohtani et al. | 437/88 |
| 5,712,495 A | 1/1998 | Suzawa | 257/51 |
| 5,923,962 A | 7/1999 | Ohtani et al. | 438/150 |
| 6,259,120 B1 | 7/2001 | Zhang et al. | 257/72 |
| 6,448,612 B1 | 9/2002 | Miyazaki et al. | 257/344 |
| 6,518,594 B1 | 2/2003 | Nakajima et al. | 257/59 |
| 6,617,644 B1 | 9/2003 | Yamazaki et al. | 257/347 |

FOREIGN PATENT DOCUMENTS

| | | |
|---|---|---|
| JP | 07-130652 | 5/1995 |
| JP | 08-078329 | 3/1996 |
| JP | 10-092576 | 4/1998 |
| JP | 10-135468 | 5/1998 |
| JP | 10-135469 | 5/1998 |
| WO | WO 90/13148 | 11/1990 |

OTHER PUBLICATIONS

Schenk, H. et al, "Polymers for Light Emitting Diodes," Eurodisplay '99 Proceedings of the 19th International Display Research Conference, Berlin, Germany, pp. 33-37, Sep. 6-9, (1999).

(Continued)

Primary Examiner—Minh-Loan Tran
(74) Attorney, Agent, or Firm—Cook, Alex, McFarron, Manzo, Cummings & Mehler, Ltd.

(57) ABSTRACT

A semiconductor device that uses a high reliability TFT structure is provided. The gate electrode of an n-channel type TFT is formed by a first gate electrode and a second gate electrode that covers the first gate electrode. LDD regions have portions that overlap the second gate electrode through a gate insulating film, and portions that do not overlap. As a result, the TFT can be prevented from degradation in an ON state, and it is possible to reduce the leak current in an OFF state.

42 Claims, 24 Drawing Sheets

OTHER PUBLICATIONS

Hatano, M. et al, "A Novel Self-Aligned Gate-Overlapped LDD Poly-Si TFT with High Reliability and Performance," International Electron Devices Meeting, Washington, D.C., Dec. 7-10, IDEM Technical Digest '97, pp. 523-526, (1997).

U.S. Appl. No. 09/432,662 (pending) to Yamazaki et al, including specification, claims, abstract, drawings and PTO filing receipt.

U.S. Appl. No. 09/441,025 (pending) to Nakajima et al, including specification, claims, abstract, drawings and PTO filing receipt.

U.S. Appl. No. 09/441,258 (pending) to Nakajima et al, including specification, claims, abstract, drawings and PTO filing receipt.

CMOS circuit      pixel matrix circuit

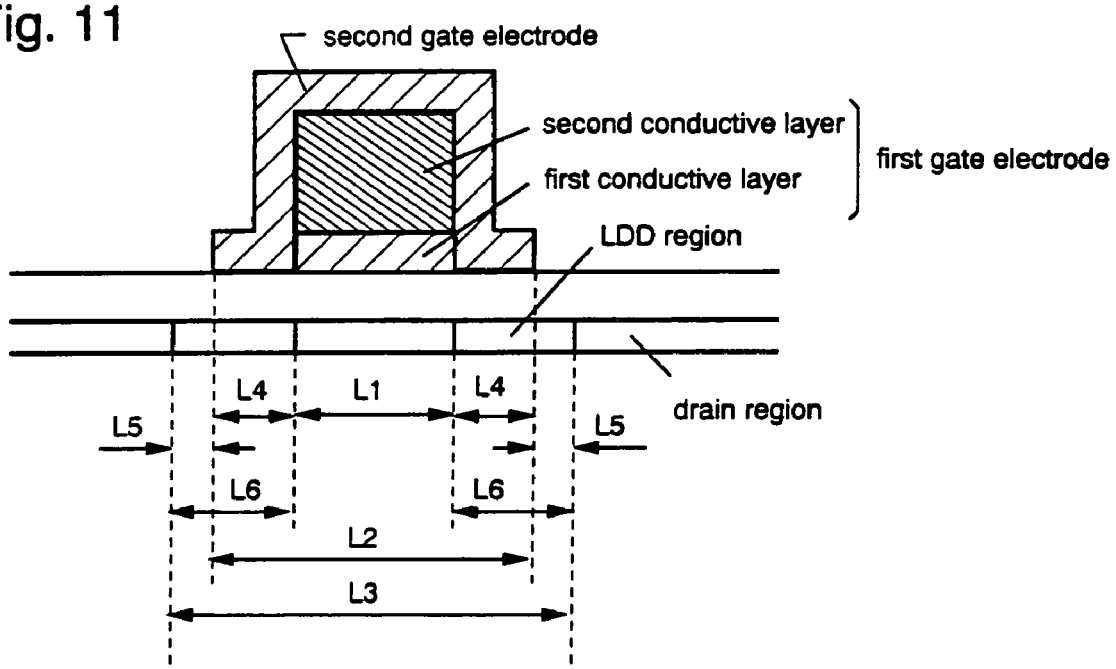

Fig. 13(IA) Prior Art
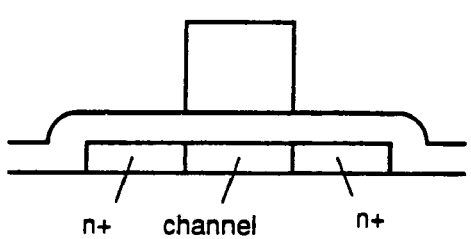
Fig. 13(IB) Prior Art
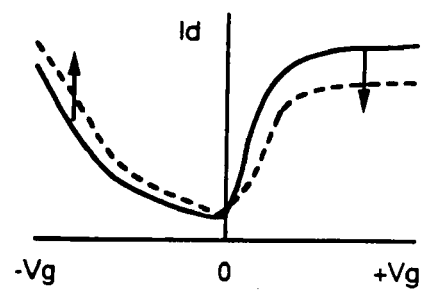
Fig. 13(IIA) Prior Art
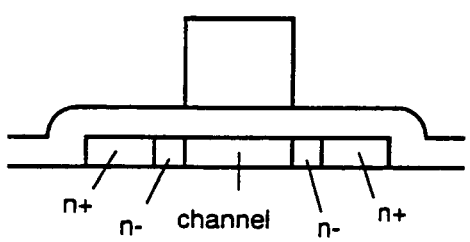
Fig. 13(IIB) Prior Art
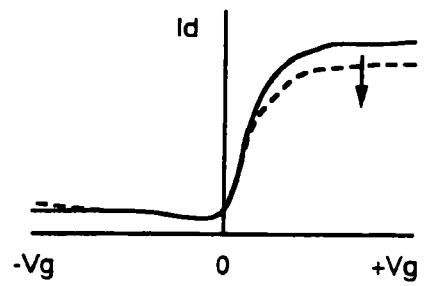
Fig. 13(IIIA) Prior Art
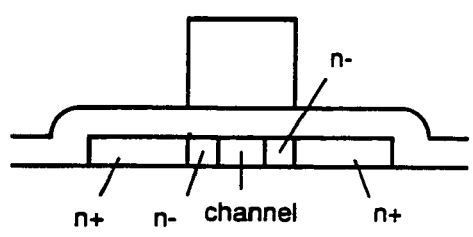
Fig. 13(IIIB) Prior Art
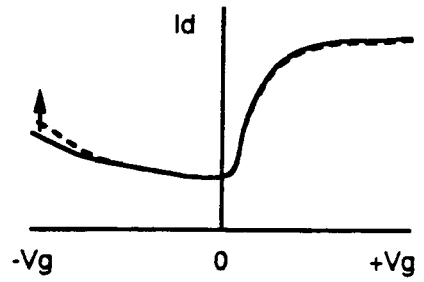
Fig. 13(IVA)
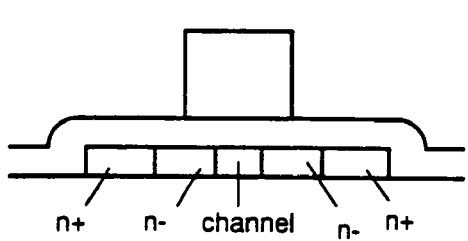
Fig. 13(IVB)
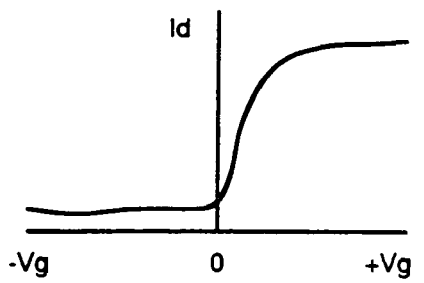

Heat treatment process

CMOS circuit      pixel matrix circuit

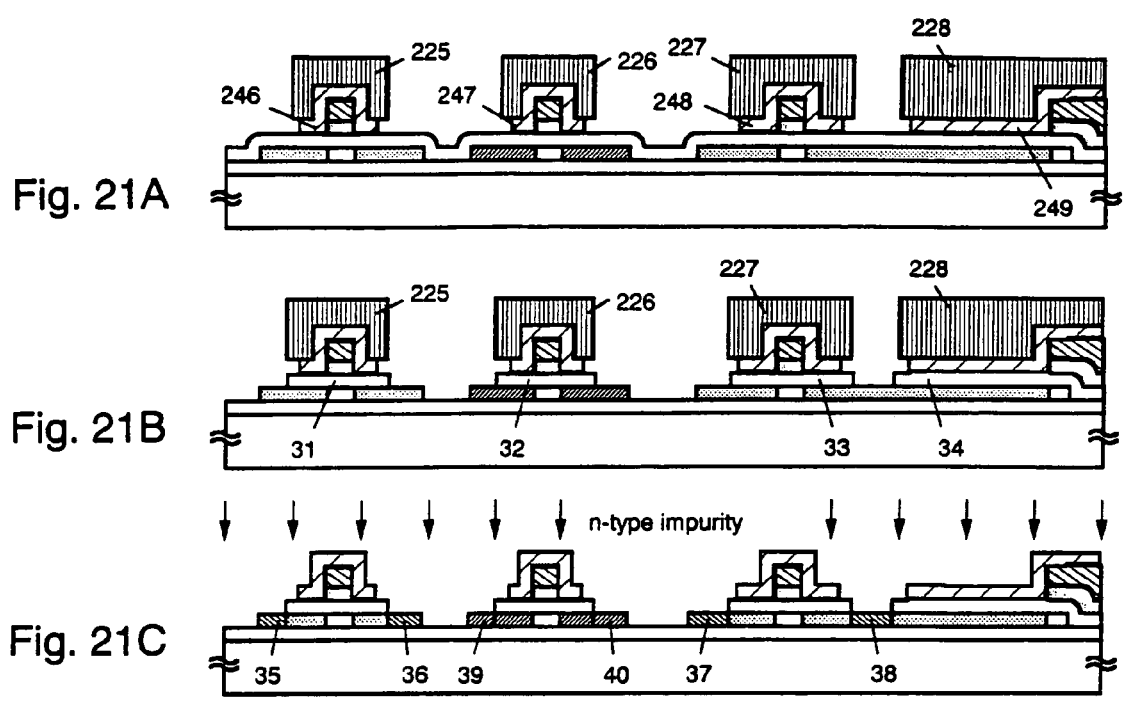
Fig. 21A
Fig. 21B
Fig. 21C
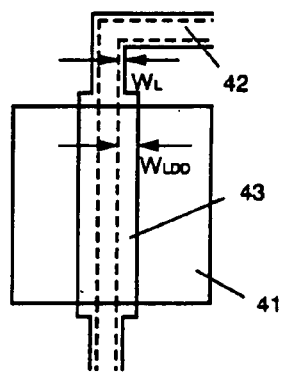
Fig. 22

ELECTRO-OPTICAL DEVICE AND MANUFACTURING METHOD THEREOF

This application is a continuation of U.S. application Ser. No. 10/262,261, filed on Oct. 1, 2002, now U.S. Pat. No. 6,791,112 which is a continuation of U.S. application Ser. No. 09/441,026, filed on Nov. 16, 1999 (now U.S. Pat. No. 6,512,271 issued Jan. 28, 2003).

BACKGROUND OF THE INVENTION

1. Field of the Invention

The present invention relates to a semiconductor device having circuits structured with thin film transistors (hereinafter referred to as TFT). For example, the present invention relates to the structure of electro-optical devices, typically liquid crystal display panels, and the structure of electronic equipment loaded with the electro-optical devices as parts. Note that throughout this specification semiconductor device indicates general devices that acquire their functions through the use of semiconductor characteristics, and that electro-optical devices, semiconductor circuits, and electronic equipment are also semiconductor devices.

2. Description of the Related Art

A TFT can be formed on a transparent glass substrate, so that the development of applications to active matrix type liquid crystal display devices has been positively carried out. High mobility can be obtained in a TFT utilizing a crystalline semiconductor film (hereinafter referred to as crystalline TFT), so that functional circuits are integrated on the same substrate to realize high definition image displays.

When active matrix type liquid crystal display devices have a highly minute screen resolution, it follows that one million TFT are necessary number of pixels alone. Further, by adding a functional circuit, an even higher number of TFTs becomes necessary. In order to operate a liquid crystal display device stably, it is necessary to ensure the reliability of each individual TFT, and to operate them stably.

However, TFTs are not always equal from a reliability standpoint to MOS transistors manufactured on a single crystal semiconductor substrate. The off current (leak current) is liable to become large for a TFT, so that the phenomenon of a drop in mobility and in the on current has frequently been observed, if operated over a long period of time. As one cause for the occurrence of these phenomenons, it is thought that there is a degradation of the properties due to a hot carrier generated by an increase in the channel electric field.

On the other hand, the LDD (lightly doped drain) structure is well known as a technique for increasing the reliability with a MOS transistor. This structure has, on the inside of the source and drain regions, an even lower concentration impurity region. This low concentration impurity region is called an LDD region, and this structure can be employed with a TFT. With conventional techniques, the low concentration impurity region that becomes the LDD region is formed by a first impurity doping process using a gate electrode as a mask, and thereafter an anisotropic etching technique is utilized to form sidewalls on both sides of the gate electrode. High concentration impurity regions that become the source and drain regions are formed by a second impurity doping process using the gate electrode and the sidewalls as masks.

In addition, a structure in which the LDD region overlaps the gate electrode to some degree, through a gate insulating film, is known for a MOS transistor. There are several methods for forming this structure, and for example, GOLD (gate-drain overlapped LDD) and LATID (Large-tilt-angle implanted drain) are known. By using this type of structure, it is possible to lower the impurity concentration in the LDD region, and the hot carrier tolerance can be increased as the effective relaxation on the electric field becomes larger.

In addition, attempts have been made in which these MOSFET advantages are applied to a TFT. For example, Hatano et al (M. Hatano, H. Akimoto, and T. Sakai, IEDM97 Technical Digest, p. 523–6) realized a GOLD structure that uses sidewalls formed by silicon.

However, compared with a normal LDD structure, the structure published in the paper has a problem in that the off current (the current that flows when the TFT is in the off state) gets large, and hence a countermeasure therefor is necessary.

In order to attain high reliability with a TFT, it is necessary to examine from an element structure perspective, as in the MOS transistor technical field. However, an LDD region can be formed in a self-aligning manner, with the conventional method stated above, but it is difficult to have the gate insulating film remain well in selectiveness with the anisotropic etching process for the sidewall film, and this leads to property variations. Also, there remains a problem in that an off current is large.

SUMMARY OF THE INVENTION

The present invention provides a technique in order to overcome these types of problems, and therefore has an object of the invention to provide a TFT with a novel structure in which a gate electrode and an LDD region are overlapped each other. In order to achieve the above-mentioned object of the invention, the present invention has another object thereof to provide a technique of manufacturing a TFT with an overlapped structure of the gate electrode and the LDD region, which is simple and easier compared with the prior arts. In addition, the present invention has still another object thereof to provide a highly reliable semiconductor device in which circuits are formed with TFTs having high reliability.

In the present invention, an n-channel type TFT gate electrode is constructed by a first gate electrode and a second gate electrode that covers the first gate electrode. In this case, any conductive films can be used for the first gate electrode, but the present invention is characterized in that a semiconductor film is used for the second gate electrode.

The second gate electrode functions not only as a gate electrode, but also fulfills the role of protecting the first gate electrode.

Further, in the present invention, the semiconductor layer (active layer) of the n-channel type TFT is made up of a channel forming region, a first impurity region formed in contact with the channel forming region, and a second impurity region formed in contact with the first impurity region. The second gate electrode is formed so as to cover the first gate electrode, while an additional part of the first impurity region is also formed to overlap.

The first impurity region is a region having a lower concentration for an impurity element (i.e., a periodic table group 15 element because this is an n-channel type TFT) than that of the second impurity region, which becomes a source region or a drain region, and is called a low concentration impurity region or an LDD region. In the present invention, the second gate electrode overlaps the first impurity region, through a gate insulating film, thereby making it possible to suppress hot carrier injection and to prevent degradation.

Furthermore, the off current can be suppressed because there is also an area in the first impurity region where the second gate electrode does not overlap, and that portion works as a resistive body.

BRIEF DESCRIPTION OF THE DRAWINGS

In the accompanying drawings:

FIG. 11 is a view showing the structure of the gate electrode of the present invention;

FIGS. 13(IA) to 13(IVB) are views showing characteristics of the electrical property for several types of TFT structure;

FIGS. 21A to 21C are cross sectional views showing the manufacturing process of a TFT;

FIG. 22 is a top view showing the structure of a gate wiring (including a gate electrode);

DETAILED DESCRIPTION OF THE PREFERRED EMBODIMENTS

Figure 1A:
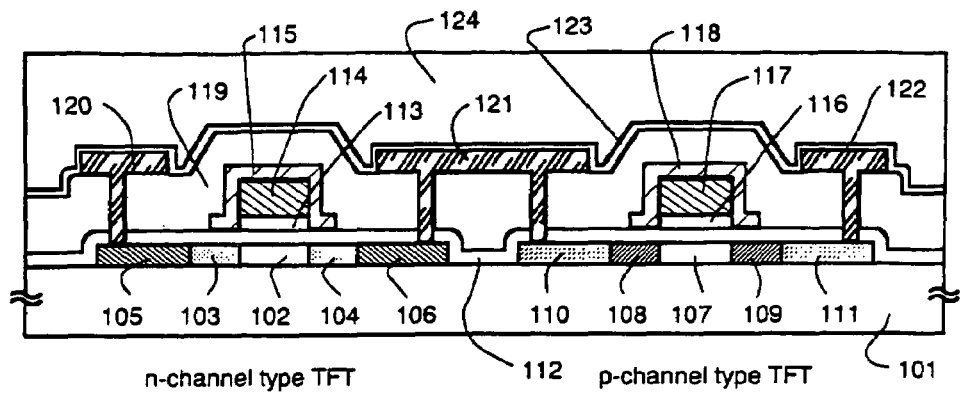
FIGS. 1A to 1C are cross sectional views of a TFT of an embodiment of the present invention.

FIG. 1A is used to explain the preferred embodiments of the present invention. Reference numeral 101 denotes a substrate with an insulating surface. For example, a glass substrate that is formed with a silicon oxide film thereon, a stainless steel substrate, a plastic substrate, a ceramic substrate, or a silicon substrate can be used. In addition a quartz substrate may also be used.

It is desirable that the semiconductor layer formed on the above substrate be a crystalline semiconductor formed by using a laser crystallization method or a solid phase crystallization method, through annealing treatment, of an amorphous semiconductor formed by a deposition process such as plasma CVD, low pressure CVD, sputtering, etc. It is also possible to use a microcrystalline semiconductor formed by the above-stated deposition process. Applicable semiconductor materials include silicon, germanium, alloys of silicon and germanium, and silicon carbide, and other than the above, compound semiconductor materials such as gallium arsenide can also be used.

Cross sections of an n-channel type TFT and a p-channel type TFT, formed on the above substrate, are shown in FIG. 1A. The n-channel type TFT and p-channel type TFT gate electrodes are made from a first gate electrode and a second gate electrode, respectively. The first gate electrode on the n-channel type TFT is made from a first conductive layer 113 formed to contact a gate insulating film 112, and a second conductive layer 114 formed to contact the first conductive layer 113. The first gate electrode on the p-channel type TFT is made from a first conductive layer 116 formed to contact the gate insulating film 112, and a second conductive layer 117 formed to contact the first conductive layer 116.

Then, a second gate electrode 115 is formed to cover the first gate electrode of the n-channel type TFT, and also to contact the gate insulating film 112. Further, a second gate electrode 118 is formed to cover the first gate electrode of the p-channel type TFT, and also to contact the gate insulating film 112.

The first gate electrode is formed of thin films containing elements selected from silicon (Si), titanium (Ti), tantalum (Ta), tungsten (W), molybdenum (Mo), aluminum (Al), or copper (Cu), laminates of such thin films, or thin films of alloy containing any of the above-enumerated elements:.

In addition, the first conductive layers 113 and 116, which make up the first gate electrode, are formed of an element such as silicon, titanium, tantalum, or from an alloy containing one of these elements as its main constituent. Further, the second conductive layers 114 and 117 may be made from low electrical resistivity materials such as aluminum (Al) or copper (Cu). For copper, however, it is necessary to use a structure in which copper is surrounded by silicon nitride in order to prevent diffusion of elemental copper.

Note that if silicon is used, by doping impurity elements, silicon can be made to have conductivity and is used as a silicon film possessing conductivity (hereinafter referred to as conductive silicon film).

Considering that the TFT of the present invention is formed on a large area substrate such as a liquid crystal display device, the second conductive layer is formed with the aim of reducing the electrical resistance of the gate electrode. Therefore, depending upon its use, the fist gate electrode may be formed by only the first conductive layer. In addition, a further conductive layer may be formed in layers on the second conductive layer.

The second gate electrodes 115 and 118 electrically conduct to the first gate electrodes. A semiconductor film (specifically a conductive silicon film) is used as the second gate electrodes for the present invention. There are many advantages in using a conductive silicon film.

First, the following points illustrate the superiority of using a conductive silicon film for the second gate electrode: its coatability is high in relation to the first gate electrode; it is easy to obtain a fine pattern; and there is no fear of dispersion into an insulating film (especially a gate insulating film). Further, the conductivity can easily be regulated by doping a periodic table group 13 or group 15 element such as carbon, nitrogen or oxygen, another point of superiority.

Note that an amorphous silicon film, a crystalline silicon film (a polysilicon film or a single crystal silicon film), or a microcrystalline silicon film can be used as the silicon film. Further, it is possible to use semiconductor films with silicon as the main constituent, such as a silicon germanium film, not only silicon films.

Then, the second gate electrode completely cover the first gate electrode, and additionally extend to the gate insulating film 112. As shown in FIG. 11, if the first gate electrode has a length (line width) of L1, and if the second gate electrode has a length (line width) of L2, then L1<L2 is maintained. Specifically, it is desirable that L1 is between 0.1 and 10 $\mu$m (typically from 0.2 to 5 $\mu$m), and that L2 is between 0.3 and 14 $\mu$m (typically from 0.8 to 8 $\mu$m).

However, as stated below, the first gate electrode and the second gate electrode function as masks to form a source region, a drain region, or an LDD region by doping the semiconductor layer with impurities, so that it is necessary to determine the values of L1 and L2 in consideration of this point.

The semiconductor layer of an n-channel type TFT is structured with a channel forming region 102, first impurity regions 103 and 104, formed to contact both sides of the channel forming region 102, and a second impurity region (source region) 105 and a second impurity region (drain region) 106, formed to contact the first impurity regions 103 and 104. The first impurity regions 103 and 104 are formed to overlap, through the gate insulating film 112, the region where the second gate electrode 115 contacts the gate insulating film 112.

The semiconductor layer of a p-channel type TFT is structured with a channel forming region 107, first impurity regions 108 and 109, formed to contact both sides of the channel forming region 107, and a second impurity region (source region) 111 and a second impurity region (drain region) 110, formed to contact the first impurity regions 108 and 109. The first impurity regions 108 and 109 are formed to overlap, through the gate insulating film 112, the region where the second gate electrode 118 contacts the gate insulating film 112.

However, the most important characteristic of the present invention is not simply the fact that the first impurity regions 103 and 104 overlap the second gate electrode 115, but that only a portion overlaps. Namely, the first impurity regions 103 and 104 include a portion that overlaps the second gate electrode 115, through the gate insulating film 112 (the portion where a gate voltage is applied), and a portion that does not overlap (the portion where the gate voltage is not applied).

Figure 1B:
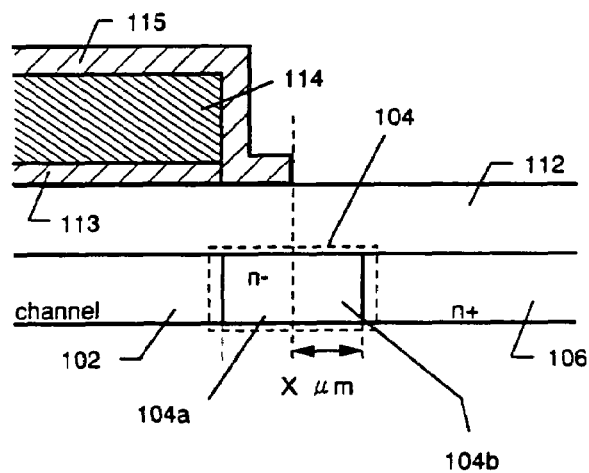

This condition is shown in FIG. 1B. Note that the reference numerals in FIG. 1B correspond to those of FIG. 1A. As shown in FIG. 1B, the first impurity region 104 (referred to as low concentration impurity region, or LDD region throughout this specification) is separated into a portion that overlaps the second gate electrode 115, through the gate insulating film 112 (a gate-overlapped LDD region 104*a*), and a portion that does not overlap (a non-gate-overlapped LDD region 104*b*).

Figure 1C:
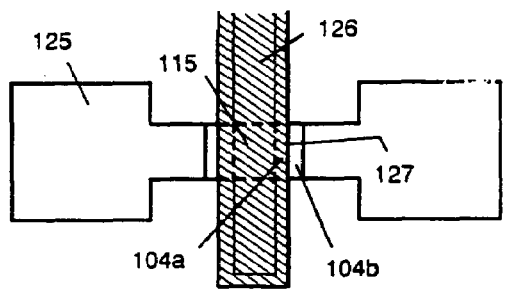

FIG. 1C shows this state as viewed from above. In FIG. 1C, the area where a semiconductor layer 125 and a gate wiring 126 intersect in particular is called the second gate electrode 115, and an edge portion 127 on the second gate electrode 115 formed by this intersection is positioned above the first impurity region 104.

It is desirable that the length of the gate-overlapped LDD region 104*a* (corresponding to L4 in FIG. 11) be between 0.1 and 2 $\mu$m (typically from 0.3 to 1.5 $\mu$m), and the length of the non-gate-overlapped LDD region 104*b* (corresponding to L5 in FIG. 11) be between 0.1 to 2 $\mu$m (typically from 0.3 to 1 $\mu$m).

Note that the first impurity regions 103 and 104 (corresponding to L6 in FIG. 11) have lengths of between 0.2 and 4 $\mu$m (typically from 0.6 to 2.5 $\mu$m), and that the concentration of the n-type imparting impurity element (a periodic table group 15 element, typically phosphorous or arsenic) is between $1\times10^{16}$ and $1\times10^{19}$ atoms/cm$^3$, typically between $1\times10^{17}$ and $5\times10^{18}$ atoms/cm$^3$. Further, the impurity concentration in the source region 105 and the drain region 106 should be between $1\times10^{19}$ and $1\times10^{21}$ atoms/cm$^3$, typically between $1\times10^{20}$ and $5\times10^{20}$ atoms/cm$^3$.

At this point, the channel forming region 102 is formed by either an intrinsic semiconductor layer or a semiconductor layer doped beforehand with boron of a concentration of between $1\times10^{16}$ and $5\times10^{18}$ atoms/cm$^3$. The boron is doped in order to control the threshold voltage, but other elements may be substituted provided that a similar effect can be obtained.

On the other hand, a p-type imparting impurity element (a periodic table group 13 element, typically boron) is doped at the same concentration into impurity regions 108 to 111 (taken together and called a third impurity region) on the p-channel type TFT.

Then a p-type imparting impurity element is doped at a concentration of from 1.5 to 3 times the impurity concentration doped into the source region 105 and the drain region 106 on the n-channel type TFT.

In addition, the impurity regions 110 and 111 include the impurity element having the same concentration (n-type imparting impurity element) as that of the second impurity regions 105 and 106 on the n-channel type TFT when formed by the manufacturing method of the present invention. In other words, one portion of the third impurity region includes a periodic table group 15 element at the same concentration as that of the second impurity region.

As shown above, the gate electrode in the structure of the TFT of the present invention is constructed by the first gate electrode and the second gate electrode that covers the first gate electrode. The second gate electrode is formed to contact the first gate electrode and the gate insulating film, as shown in FIG. 1A.

The structure and manufacturing method of the present invention are characterized in that the first impurity region, formed in the semiconductor layer through the gate insulating film, and the region in which the second gate electrode contacts the gate insulating film, partially overlap.

The TFT shown in FIG. 1A has a structure in the n-channel type TFT, especially, in which the first impurity regions 103 and 104 (low concentration), which function as the so-called LDD region, are formed to overlap the second gate electrode, through the gate insulating film. Therefore it is possible to obtain advantages similar to those of a MOS transistor GOLD structure or LATID structure. In addition, there are portions of the first impurity regions 103 and 104 that do not overlap the second gate electrode, and those portions function substantially as resistive bodies.

On the other hand, these low concentration impurity regions which become the LDD structure are not formed on the p-channel type TFT. Of course a structure in which low concentration impurity regions are formed is acceptable, but the p-channel type TFT originally has had high reliability, so that it is desirable to make a gain in the on current and have a balance of characteristics with the n-channel type TFT. When applying the present invention to a CMOS circuit as shown in FIG. 1A, attaining this balance of characteristics is especially important. However, the present invention may be applied to a p-channel type TFT with no problems.

After completing the n-channel type TFT and the p-channel type TFT, both are covered with a first interlayer insulating film 119, and source electrodes 120 and 122, and a drain electrode 121 are formed to provide contact with the source regions 105 and 111, and the drain regions 106 and 110, respectively. A silicon nitride film is then formed as a passivation film 123 in the structure of FIG. 1A. A second interlayer insulating film 124 is then formed from a resinous material. It is not necessary to limit the second interlayer insulating film 124 to a resinous material, but it is desirable, for example, to use a resinous material to make surface level when the present invention is applied to a liquid crystal display device.

An example of a CMOS circuit in which the n-channel TFT and the p-channel TFT are complimentarily combined is shown in FIG. 1A, but the present invention is also applicable to an NMOS circuit using n-channel type TFT and to pixel section of a liquid crystal display device.

<Advantages of the n-channel Type TFT Structure in the Present Invention>

The n-channel type TFT of the present invention is characterized in that it is formed so that a portion of each first impurity region (LDD region) overlaps the gate electrode, and there are areas within the LDD region to which the gate voltage is applied, and areas to which the gate voltage is not applied.

The superiority of the present invention when compared to conventional structures is explained here. FIGS. 13(IA) and 13(IB) are views of an n-channel type TFT without an LDD structure (hereinafter referred to as NTFT), and its electrical characteristics (gate voltage Vg vs. drain current Id). Similarly, the same is shown in FIGS. 13(IIA) and 13(IIB) for the case of a normal LDD structure, in FIGS. 13(IIIA) and 13(IIIB) for the case of an LDD structure overlapping a gate electrode, and in FIGS. 13(IVA) and 13(IVB) for the n-channel type TFT of the present invention.

Note that n$^+$ indicates the source region or the drain region, channel indicates the channel forming region, and n- indicates the LDD region throughout the figure. In addition, Id is the drain current, and Vg is the gate voltage. The dashed lines denote the degradations of the on current.

For the case of no LDD, as shown in FIGS. 13(IA) and 13(IB), the off current is high, the both the on current (the current when the TFT is in the on state) and the off current deteriorate very easily.

Then, for the case of an LDD structure, as shown in FIGS. 13(IIA) and 13(IIB), the off current is rather suppressed, and the on current degradation and the off current degradation can be controlled to a certain extent. However, the on current degradation is not completely controlled.

Next, for a structure where the LDD region and the gate electrode overlap, as shown in FIGS. 13(IIIA) and 13(IIIB), the important point is that this structure can control the on current degradation.

While degradation of the on current is sufficiently controlled in this case, there is a problem in that the off current is somewhat higher than for a normal LDD structure. The paper that is cited as a conventional example employs this structure, but in addition to recognizing that there is a problem with this high off current, the present invention strives for a structure in order to solve this problem.

Then, the structure of the present invention, as shown in FIGS. 13(IVA) and 13(IVB), is made such that one portion in overlapping relation with the gate electrode, and one portion in non-overlapping relation there with is formed in the LDD region. By employing this structure, it is possible to sufficiently control the degradation of the on current, and at the same time reduce the off current.

The structure of the present invention shown above will be explained in further detail by the embodiments below.

[Embodiment 1]

Embodiment 1 shows an example of the structure of the present invention applied to a liquid crystal display device. FIGS. 2A to 2E, and FIGS. 3A and 3B, are used to explain the method of simultaneously manufacturing a pixel section and a CMOS circuit, the basic form of the drive circuit formed around the pixel section.

Note that an n-channel type TFT is used in Embodiment 1 as the pixel TFT forming the pixel section. In addition, in order to reduce the off current (the current that flows when the TFT is in the off state), a multi-gate structure such as a double gate structure or a triple gate structure is desired. Embodiment 1 actually employs a double gate structure, but for simplicity, only a single gate structure is shown in the figures.

First, a non-alkaline glass substrate, typically a Corning 1737 glass substrate, is used as a substrate 201. Then a base film 202 of silicon oxide with a thickness of 200 nm is formed on the surface of the substrate 201 on which the TFT will be formed. The base film 202 may be a laminate of further silicon oxide films, or may be a single silicon oxide film.

Next, a 50 nm thick amorphous silicon film is formed by plasma CVD on the base film 202. Dehydrogenation is performed by heating to between 400 and 500° C., desirably, although this depends on the amount of hydrogen contained in the amorphous silicon film. The amount of hydrogen in the amorphous silicon film is reduced to below 5 atm %, and a crystallization process is performed to form a crystalline silicon film.

A known laser crystallization technique or thermal crystallization technique may be used for this crystallization process. In Embodiment 1 pulse oscillation type KrF excimer laser light is gathered into a line shape and irradiated on the amorphous silicon film, forming the crystalline silicon film.

Note that the initial film used in Embodiment 1 is an amorphous silicon film, but a microcrystalline silicon film may be used, as may a directly deposited crystalline silicon film.

The crystalline silicon film thus formed is then patterned, forming island shaped semiconductor layers 203 to 205 (hereinafter referred to as semiconductor layers 203 to 205).

Next, a gate insulating film 206, made from a silicon oxide film, an oxidized silicon nitride film, a silicon nitride film, or a laminate of more than one of these films, is formed to cover the semiconductor layers 203 to 205. An oxidized silicon nitride film is formed to have a thickness of 100 nm by plasma CVD here. Then, although not shown in the figures, a conductive silicon film is formed to have a thickness of 10 to 200 nm (50 nm in Embodiment 1), which is used as a first conductive layer, and a laminate film having three layer structure of titanium/aluminum/titanium is formed to have a thickness of 100 to 1000 nm (200 nm in Embodiment 1), which is used as a second conductive layer. The first conductive layer, and the second conductive layer, constitute first gate electrode on the surface of the gate insulating film 206.

Then, first conductive layers 207 to 210 that constitute the first gate electrode, and second conductive layers 211 to 214 that constitute the second gate electrode are formed by using a known patterning technique. Note that in FIG. 2A the second conductive layers are simplified and shown as a single layer, but actually have a structure in which titanium is sandwiched around the top and bottom surfaces of aluminum film.

In addition, patterning is performed to make the first gate electrode L1 length, shown in FIG. 11, equal to 2 µm.

When using aluminum as the second conductive layer that constitutes the first gate electrode, intrinsic aluminum may be used, and aluminum alloys with an element, chosen from titanium, silicon, scandium, and neodymium, doped at between 0.1 to 5 atm % may also be used. In addition, when using copper, although not shown in the figure, it is desirable to form a silicon nitride film on the surface of the gate insulating film 206.

Figure 2A:
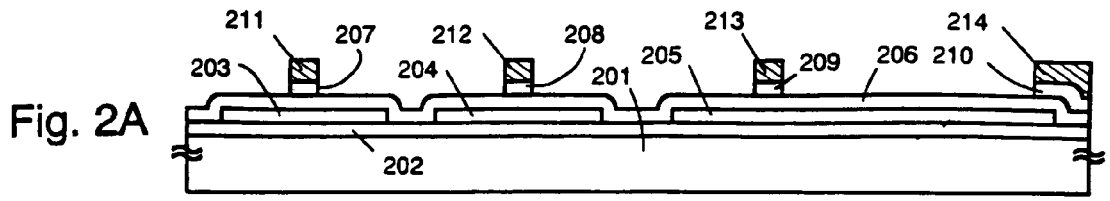
FIGS. 2A to 2E are cross sectional views showing a manufacturing process of a TFT.

Further, the structure in FIG. 2A has a supplemental capacitive section formed on the drain side of the n-channel type TFT, which constitutes the pixel section. At this time, the wiring electrodes of the supplemental capacitive section are formed from the first conductive layer 210 and the second conductive layer 214.

After forming the structure shown in FIG. 2A, a first n-type impurity doping process is performed. Phosphorous (P), arsenic (As), antimony (Sb), etc., are known as impurity elements that impart n-type into a crystalline semiconductor material, and phosphorous is used in a phosphine ($PH_3$) ion doping process here. The acceleration voltage is set high at 80 keV for this process in order to dope phosphorous through the gate insulating film 206, into the semiconductor layer underneath it.

Further, the impurity region formed in this way is a portion that, as will be shown later, forms first impurity regions 241 and 242 on the n-channel type TFT and functions as the LDD region. Therefore it is desirable that the phosphorous concentration in this region be between $1\times10^{16}$ to $1\times10^{19}$ atoms/cm$^3$. It is $1\times10^{18}$ atoms/cm$^3$ here. Impurity regions formed in this way are called an n$^-$ region throughout this specification.

Further, it is necessary to activate the impurity element doped throughout the semiconductor layer by laser annealing or annealing treatment. This process may be performed after the impurity doping process that forms the source region and the drain region, but it is effective to activate by laser annealing at this stage.

Figure 2B:
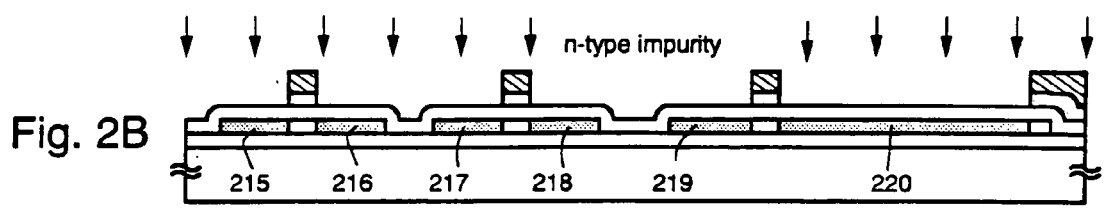

The first conductive layers 207 to 210 and the second conductive layers 211 to 214, which constitute the first gate electrodes, function as masks against phosphorous doping in this process. Namely, phosphorous is not doped into the region directly under the first gate electrodes in the semiconductor layer existing through the gate insulating film. Then low concentration impurity regions 215 to 220, into which phosphorous has been doped, are formed, as shown in FIG. 2B.

Note that the low concentration impurity region 220 formed here functions later as a lower electrode of the supplemental capacitive section. An n$^-$ region can be used as the lower electrode of the supplemental capacitive section with the manufacturing method of the present invention. In addition, the supplemental capacitive section electrodes are all called capacitor electrodes throughout this specification, but when necessary, this is adapted to "upper electrode" or "lower electrode".

Normally, when semiconductor layers are used as supplemental capacitive section electrodes, they must be made to function as electrodes by applying a voltage and inverting the semiconductor layer. In the past, semiconductor layers were intrinsic, so that a relatively large voltage had to be applied. The present invention, however, has the advantage of using an n-type semiconductor layer, so that the required voltage becomes smaller (power consumption becomes smaller).

Next, the regions that form the n-channel type TFT are covered with photoresist layers 221 and 222, and an impurity doping process is performed to impart p-type conductivity only to the region that forms the p-channel type TFT. Boron (B), aluminum (Al), and gallium (Ga) are known as a p-type imparting impurity elements. Boron is doped as this impurity element here by using diborane ($B_2H_6$) in an ion doping process.

Figure 2C:
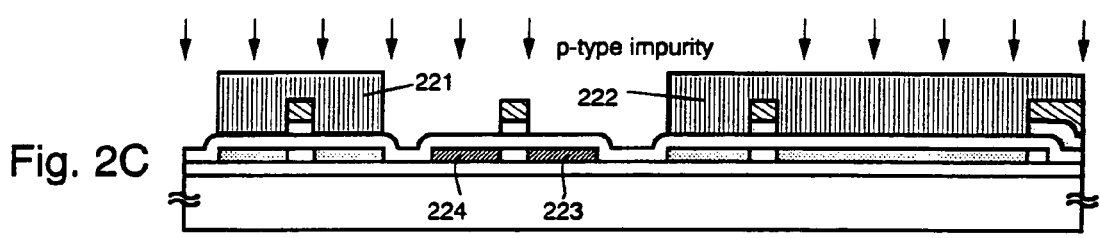

Boron is also doped here, with an acceleration voltage of 80 keV, to a concentrations of $2\times10^{21}$ atoms/cm$^3$. Then high concentration boron doped regions 223 and 224 are formed as shown in FIG. 2C. These regions will later become the p-channel type TFT source or drain regions.

After removing the resist masks 221 and 222, a process is then performed to form the second gate electrode. The same conductive silicon film material as in the first conductive layers is used for the second gate electrode, formed to a thickness of between 100 and 1000 nm (200 nm in Embodiment 1). The line width of the second gate electrode (corresponding to L3 in FIG. 11) is 5 µm. In other words, the portions that do not overlap the first gate electrode (corresponding to L6 in FIG. 11) are regulated to be 1.5 µm.

Note that L3 may be chosen in the range of 0.5 to 18 µm (typically from 1.4 to 10 µm), and that L6 may be chosen in the range of 0.2 to 4 µm (typically from 0.6 to 2.5 µm) for the present invention.

Further, in order to increase the coatability to the first gate electrode, conductive silicon films (phosphorous doped amorphous silicon in Embodiment 1) are formed by low pressure thermal CVD. Conductive silicon films manufactured by low pressure thermal CVD have high coatability of the pattern side surface, and are suitable for realizing the structure of the present invention. Of course plasma CVD and sputtering may also be used, but it is necessary to be careful not to break any lines on the side surface of the first gate electrode.

Patterning is then performed using a known technique and photoresist films 225 to 228 are formed. The conductive silicon films are etched, forming second gate electrodes 229 to 231. As stated above, the second gate electrodes are patterned at this time to form regions that contact the gate insulating film at a length of 1.5 µm (corresponding to L6 in FIG. 11), on both sides of the first gate electrodes.

Further, the supplemental capacitive section is formed on the drain side of the n-channel type TFT, which constitutes the pixel section, but the supplemental capacitive section electrode (upper electrode) 232 is formed at the same time as the second gate electrode.

A second n-type imparting impurity element doping process is then performed, using photoresist films 225 to 228 as masks, and forming impurity regions 233 to 238. An ion doping process using phosphine ($PH_3$) is performed, as is similar to the phosphorous doping process as stated above. Phosphorous must pass through the gate insulating film 206 to be doped to the semiconductor layers underneath, so that the acceleration voltage is also set high here, to 80 keV.

The regions where phosphorous is doped here function as source or drain regions on the n-channel type TFT, so that it is desirable to have a phosphorous concentration between $1\times10^{19}$ to $1\times10^{21}$ atoms/cm$^3$. In Embodiment 1, the concentration is $5\times10^{20}$ atoms/cm$^3$. The impurity regions are called n$^+$ regions throughout this specification.

Thus, source regions 233 and 237 (or 238), and drain regions 234 and 238 (or 237) on the n-channel type TFT are formed. In addition, channel forming regions 239 and 240, low concentration impurity regions 241 and 242 (corresponding to the first impurity regions in FIG. 1A, also called LDD regions) are defined, as is a lower electrode 243 on the supplemental capacitive section.

In addition, a channel forming region 244 on the p-channel type TFT is also defined. Further, the p-channel type TFT source region 223 and the drain region 224 are also doped with phosphorous to the same concentration as the source and drain regions on the n-channel type TFT (the impurity regions 235 and 236). However, as boron is also doped by the previous process to quadruple the concentration of phosphorous, the conductor is not inverted and there are no problems with the p-channel type TFT operation. Further, an impurity region 245 (corresponding to the second impurity region in FIG. 1A) includes only phosphorous doped to the concentration of the FIG. 2B process, and boron doped to the concentration of the FIG. 2C process.

Figure 2D:
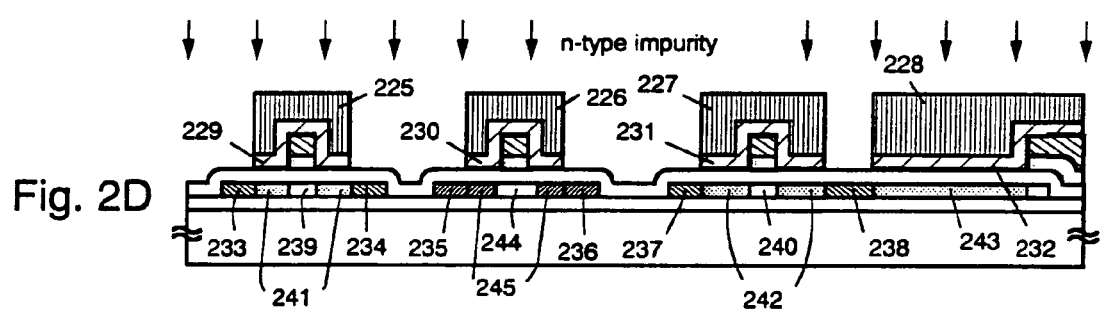

After obtaining the state in FIG. 2D, an isotropic etching process is performed on the second gate electrodes 229 to 231 and the upper electrode 232 using the photoresist films 225 to 228 as masks. The etching may be performed by wet etching using hydrazine, ethylenediamene, aqueous pyrocatechol (EPW), potassium hydroxide, TMAH (tetraethaneolammonium hydroxide), etc., or by dry etching using a gas mixture such as $CF_4+O_2$. This process is called a side etching process throughout this specification. (See FIG. 2E)

The edge portions of the second gate electrodes 246 to 248, and the upper electrode 249 retreat by approximately X µm when formed by this side etching process. The second gate electrodes were originally formed to have a wire width corresponding to L3 in FIG. 11 (0.5 to 18 µm, typically 1.4 to 10 µm), but shorten with this process to correspond to L2 in FIG. 11 (0.3 to 14 µm, typically 0.8 to 8 µm).

The present invention controls this distance (corresponding to L5 in FIG. 11) to be between 0.1 to 2 µm (preferably from 0.3 to 1 µm). Side etching is performed with X=0.5 µm in the present embodiment, so that L4 shown in FIG. 11 becomes 1 µm.

In other words, the portions of the LDD regions 241 and 242 on the n-channel type TFT which are close to the channel forming regions 239 and 240 overlap the second gate electrodes 246 and 248 by 1 µm, while the remaining 0.5 µm portions are in a state in which they do not overlap the second gate electrodes 246 and 248. Thus, an n-channel type TFT like that explained in FIG. 1A can be realized.

Next, an activation process must be performed because the n-type or p-type imparting impurity elements doped in various concentration are not activated nor ineffectively acted in this condition. Thermal annealing using an electric furnace, laser annealing using the above stated excimer laser, and rapid thermal annealing (RTA) using a halogen lamp can be used for this process.

In the thermal annealing, activation takes place at 500° C. for 2 hours in a nitrogen atmosphere. Aluminum is used for the second conductive layers that constitute the first gate electrode in Embodiment 1. However, since the first conductive layers and the second gate electrode, both formed by conductive silicon films, are formed with a covering aluminum film (literally an aluminum film sandwiched by titanium), the conductive silicon films function as blocking layers. Therefore, hillock generation, diffusion to any other region of the aluminum atom, etc. can be avoided.

Further, activation is performed in the laser annealing by irradiation of pulse oscillation type KrF excimer laser light which is gathered into a line. In addition, an even better result can be obtained by performing thermal annealing after laser annealing. This process has also an effect of annealing the region in which damage of the crystallinity has been caused by ion doping method, making it possible to improve the crystallinity.

Next, a first interlayer insulating film 250 is formed to a thickness of 1 µm. A silicon oxide film, a silicon nitride film, an oxidized silicon nitride film, an organic resin film, or a laminate of these films can be used as the first interlayer insulating film 250. Although not shown in the figures, a two layer structure is used in Embodiment 1, in which a 50 nm silicon nitride film is formed first, followed by a 950 nm thick silicon oxide film.

After forming the first interlayer insulating film 250, it is next patterned to form contact holes with each of the source regions and drain regions on the TFT. Then, source wirings (or source electrodes) 251 to 253 and drain wirings (or drain electrodes) 254 and 255 are formed. Although not shown in the figures, in Embodiment 1, these electrodes are formed by patterning a film having a three layer laminate structure of a 100 nm titanium film, a 300 nm aluminum containing titanium film, and a 150 nm titanium film, which are successively formed by sputtering.

Next, a passivation film (silicon nitride film) 256 are formed to cover the source wirings 251 to 253, the drain wirings 254 and 255, and the first interlayer insulating film 250. The passivation film 256 is formed from a 300 nm thick silicon nitride film. In addition, a second interlayer insulating film 257 is formed from an organic resin to have a thickness of about 2 µm. Polyimide, acryl, polyimidoamide, BCB (benzocyclobutene), etc. can be used as the organic resin film.

The advantages of using an organic resin film resides include a simple deposition method, a reduced parasitic capacity because the dielectric constant is low, and superior level. Note that organic resins other than those given above can be also used. A thermal polymerization type polyimide is used here, which is applied to the substrate, and thereafter is baked at 300° C.

Next, a shielding layer 258 if formed on the second interlayer insulating film 257. The shielding layer 258 may be formed from a metallic film or an organic resin film containing pigments. A titanium film is formed by sputtering here.

A third interlayer insulating film 259 is formed after forming the shielding film 258. The third interlayer insulating film 259 may be formed by using an organic resin, as is similar to the second interlayer insulating film 257. Then, contact holes that reach the drain wiring 255 are formed in the second interlayer insulating film 257 and the third interlayer insulating film 259, and a pixel electrode 260 is formed.

A transparent conducting film may be used for the pixel electrode 260 for a transmission type liquid crystal display device, while a metallic film may be used for a reflection type liquid crystal display device. A transmission type liquid crystal display device is used here, so that an indium oxide/tin oxide compound film (ITO film) is formed by sputtering to have a thickness of 100 nm, to form the pixel electrode 260.

Figure 3A:
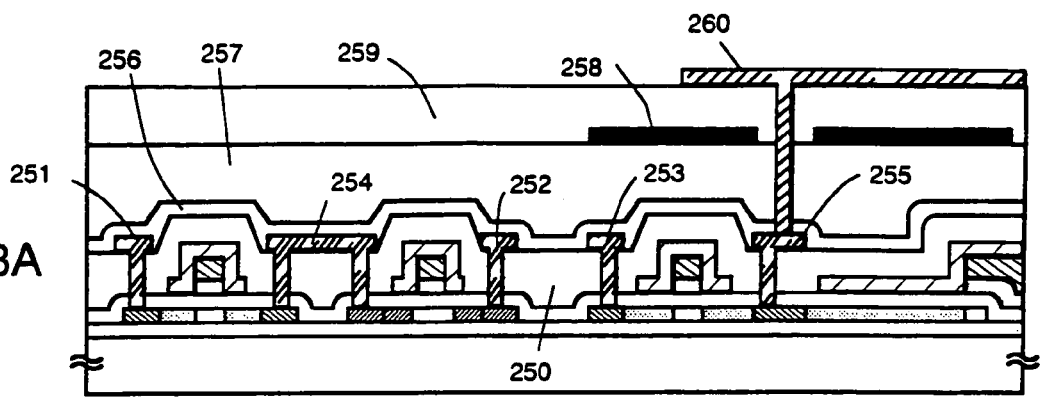
FIGS. 3A and 3B are cross sectional views showing manufacturing process of a TFT.

An orientated film 261 is formed after forming the state in FIG. 3A. A polyimide film is used in Embodiment 1 as the orientated layer 261. A transparent conducting film 263 and an orientated film 264 are formed on an opposing substrate 262. After forming the orientated films 261 and 264, a rubbing process is performed to make a parallel orientation in which the liquid crystal molecules hold a predetermined pre-tilt angle.

Figure 3B:
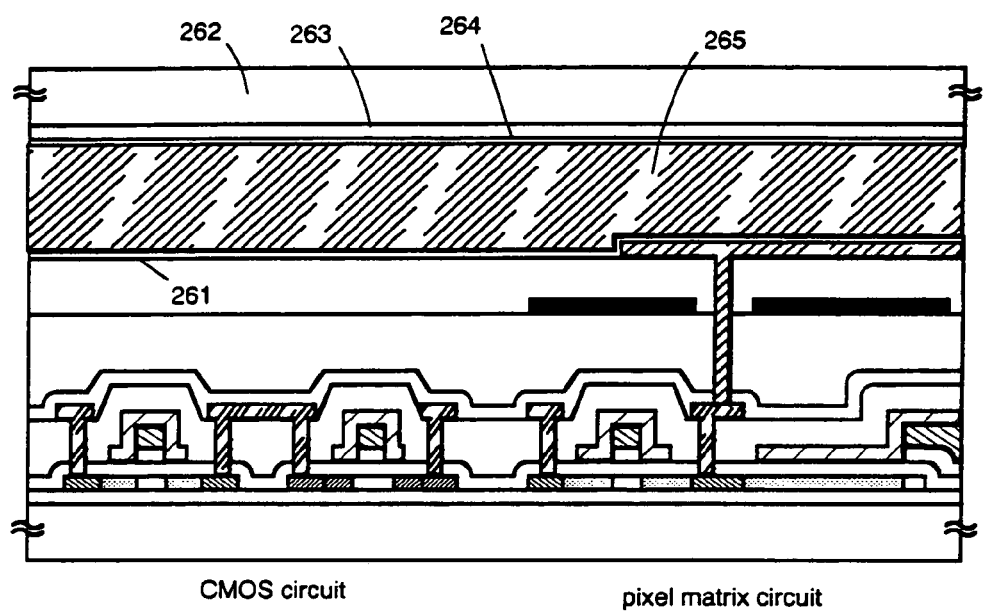

After passing through the above processes, the pixel section is adhered to the substrate, on which the CMOS circuit is formed, and the opposing substrate via a sealant material, spacers (both not shown in the figures), etc. by a known cell construction process. Afterward, a liquid crystal material 265 is injected into the space between both the substrates, and is completely sealed by a sealant. Thus, the active matrix type liquid crystal display device of FIG. 3B is completed.

Figure 10:
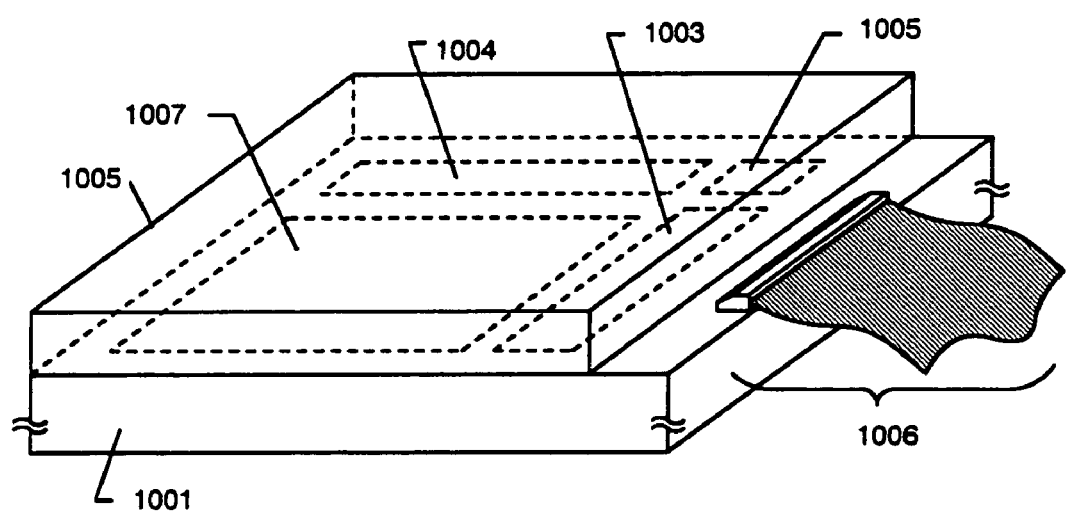
FIG. 10 is a view showing the external appearance of a liquid crystal display device.

FIG. 10 shows the external appearance of an active matrix type liquid crystal display device. A pixel section 1002, a signal line driver circuit (source driver circuit) 1003, a scanning line driver circuit (gate driver circuit) 1004, and a signal processing circuit 1005 (signal partition circuit, D/A converter circuit, correction circuit, etc.) are formed on a substrate 1001, and an FPC (flexible printed circuit) 1006 is attached thereto. Note that reference numeral 1007 denotes an opposing substrate.

Figure 4:
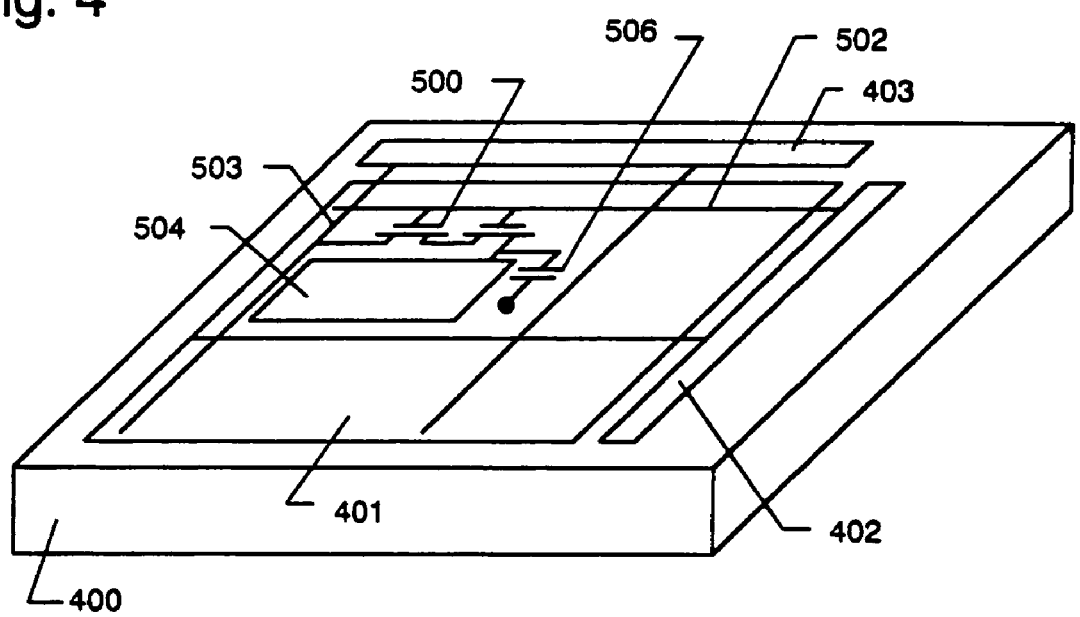
FIG. 4 is a perspective view of an active matrix substrate.
Figure 5A:
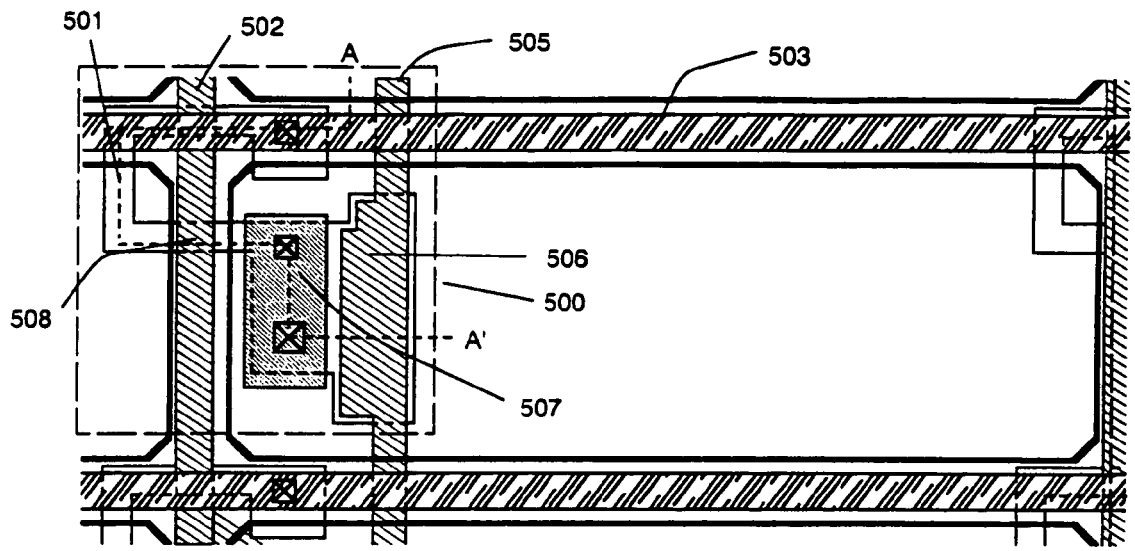
FIGS. 5A and 5B are top views of a pixel section and a CMOS circuit.
Figure 5B:
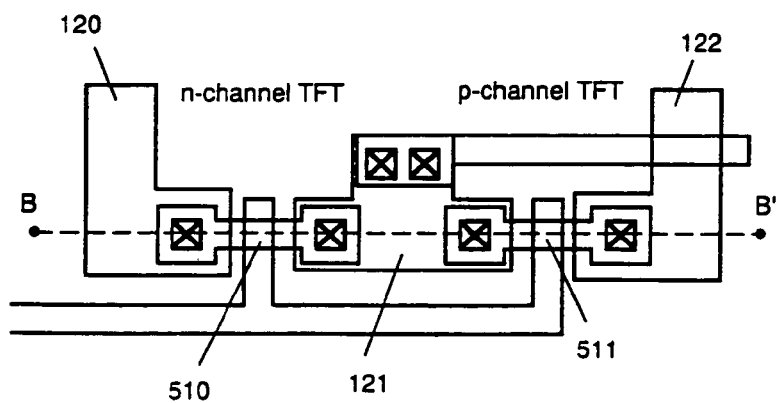

Next, the constitution of the active matrix type liquid crystal display device of Embodiment 1 is explained using FIGS. 4, 5A, and 5B. FIG. 4 is a perspective view of the active matrix substrate. The active matrix substrate includes a pixel section 401, a scanning line driver circuit (gate driver circuit) 402, and a signal line driver circuit (source driver circuit) 403, which are formed on a glass substrate 400.

These driver circuits is basically constructed by CMOS circuits. The scanning line driver circuit 402 and the signal line driver circuit 403 are connected to the pixel section 401 by a gate wiring (scanning line) 502 and a source wiring (signal line) 503, respectively. Further, a pixel TFT 500 is placed at the intersection of the gate wiring 502 and the source wiring 503, and a supplemental capacitor 506 is connected in series with the pixel TFT 500. A pixel electrode 504 is further connected in series with the pixel TFT 500 and the supplemental capacitor 506.

FIG. 5A is a top view of the pixel section 401, and is a top view of almost one entire pixel. The pixel TFT (n-channel type TFT) 500 with a double gate structure is formed on the pixel section. Note that the portion where the gate wiring 502 intersects a semiconductor layer 501 underneath it through a gate insulating film that is not shown in this figure is called a gate electrode 508 throughout this specification.

In addition, the cross sectional view of the pixel section shown in FIG. 3B corresponds to the pixel TFT 500 shown in FIG. 5A, taken along the line A–A'. A single gate structure is illustrated in FIG. 3B, which differs in cross sections from the actual pixel section, but this does not impede the better understanding of the present invention.

Further, the supplemental capacitor 506 shown in FIG. 4 is formed by sandwiching a gate insulating film (not shown) between the semiconductor layer 501 and a capacitor wiring 505. Note that the portion that essentially functions as the upper electrode (capacitor electrode) of the supplemental capacitor in the capacitor wiring 505 is the capacitor electrode 249 shown in FIG. 2E. The capacitor wiring 505 is formed at the same time as the second gate electrode, and is formed parallel to the second gate electrode.

Note that reference numeral 507 denotes a drain electrode, and it is an electrode formed to allow an ohmic connection to be easily made when connecting the pixel TFT 500 and the pixel electrode 504 with each other.

On the other hand, the cross section of the CMOS circuit shown in FIG. 5B, taken along the line B–B', corresponds to the cross sectional view of the CMOS circuit shown in FIG. 1A. Note that the portions corresponding to those in FIG. 1A are given the same reference numerals. In FIG. 5B, a gate electrode 510 is constituted by the first conductive layer 113 and the second conductive layer 114, which make up the first gate electrode, and the second gate electrode 115, these constituents being shown in FIG. 1A. Also, a gate electrode 511 is constituted by the first conductive layer 116 and the second conductive layer 117, which make up the first gate electrode, and the second gate electrode 118, these constituents being shown in FIG. 1A.

Note that the structure of the active matrix substrate according to Embodiment 1 should not be limited to the structure of Embodiment 1. The structure of the present invention is characterized by the gate electrode structure, and the formation of source region, the drain region, and other impurity regions on the semiconductor layer via the gate insulating film. Other constitutions may be suitably determined by the user.

[Embodiment 2]

Embodiment 2 shows an example where the crystalline semiconductor film, used as the semiconductor layer in Embodiment 1, is formed by a thermal crystallization method that uses a catalytic element. It is desirable to use the techniques disclosed in Japanese Patent Application Laid-Open No. Hei 7-130652 and Japanese Patent Application Laid-Open No. Hei 8-78329 when a catalyst is used.

Figure 6A:
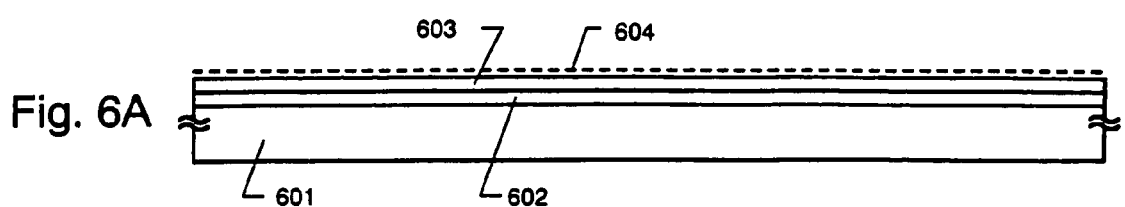
FIGS. 6A and 6B are views showing the manufacturing process of a crystalline silicon film.
Figure 6B:
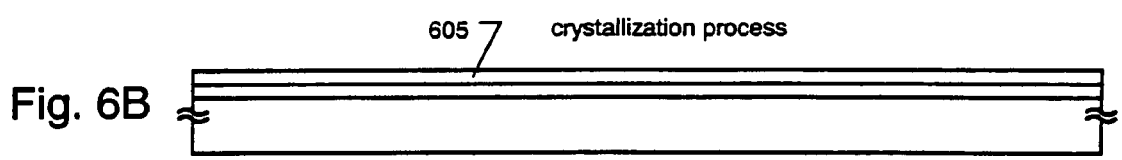

An exemplary case where the technique disclosed in Japanese Patent Application Laid-Open No. Hei 7-130652 is applied to the present invention is shown in FIGS. 6A and 6B. First, a silicon oxide film 602 is formed on a substrate 601, and an amorphous silicon film 603 is formed thereon. A nickel acetate salt solution which contains 10 ppm by weight nickel is then applied thereto, forming a nickel containing layer 604. (See FIG. 6A)

Next, after a dehydrogenation process at 550° C. for 1 hour, annealing treatment is performed at between 500 and 650° C. for between 4 and 24 hours (at 550° C. for 14 hours in Embodiment 2), forming a crystalline silicon film 605. The crystalline silicon film 605 thus obtained has extremely superior crystallinity. (See FIG. 6B)

Figure 7A:
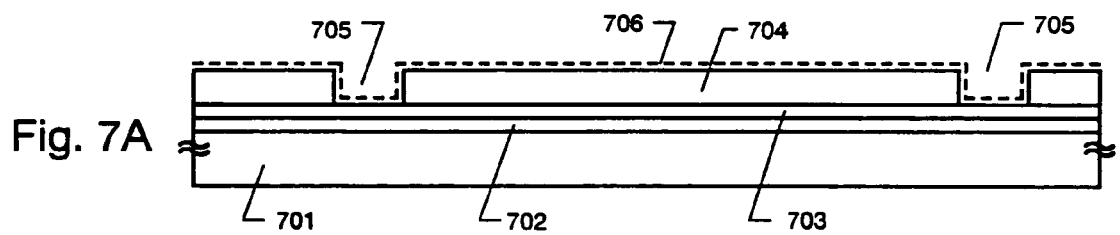
FIGS. 7A and 7B are views showing the manufacturing process of a crystalline silicon film.
Figure 7B:
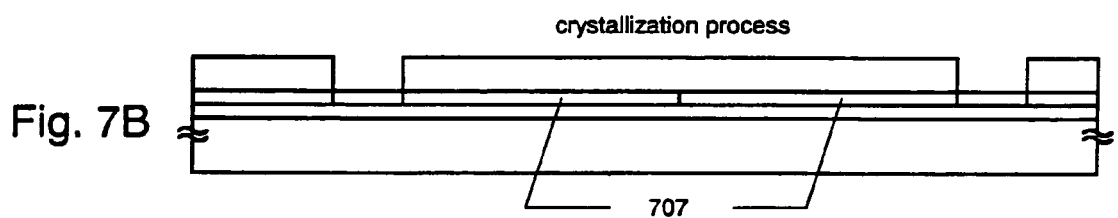

The technique disclosed in Japanese Patent Application Laid-Open No. Hei 8-78329 is a technique in which it is possible to perform selective crystallization of an amorphous semiconductor film by selective doping a catalytic element. FIGS. 7A and 7B explain the case where this technique is applied to the present invention.

First, a silicon oxide film 702 is formed on a glass substrate 701, and an amorphous silicon film 703 and a silicon oxide film 704 are formed successively thereon. In this case, the silicon oxide film 704 has a thickness of 150 nm.

The silicon oxide film 704 is then patterned, selectively forming open pore sections 705, and afterward, a nickel acetate salt solution which contains 10 ppm by weight nickel is applied thereto. Thus, a nickel containing layer 706 is formed, and the nickel containing layer 706 contacts the amorphous silicon film 703 only through the base of the open pore sections 705. (See FIG. 7A)

An annealing process is next performed at between 500 and 650° C. for between 4 and 24 hours (at 580° C. for 14 hours in Embodiment 2), forming a crystalline silicon film 707. The portion of the amorphous silicon film in contact with nickel is crystallized first in this crystallization process. Crystallization then proceeds in a sideways direction thereof. The crystalline silicon film 707 formed in this manner is a collection of rod shaped or needle shaped crystals. Macroscopically, each of the crystals grows with a specific directionality, so that this technique has the advantage of crystalline alignment.

Note that aside from nickel (Ni), the following element can be used as the catalytic element in the above two techniques: geranium (Ge); iron (Fe); palladium (Pd); tin (Sn); lead (Pb); cobalt (Co); platinum (Pt); copper (Cu); or gold (Au).

The semiconductor layer of a TFT can be made by forming a crystalline semiconductor film (including crystalline semiconductor films and crystalline silicon germanium films) using the above techniques, and then performing patterning. The TFT formed from a crystalline semiconductor film according to the technique of Embodiment 2 has superior properties, while there is a demand of high reliability therefor. However, by employing the TFT structure of the present invention, it is possible to manufacture a TFT that maximizes the technique of Embodiment 2.

[Embodiment 3]

Embodiment 3 shows an example of a process of forming the semiconductor layer used in Embodiment 1, in which the catalytic element is used to form a crystalline semiconductor film while using an amorphous semiconductor film as an initial film, as in Embodiment 2, followed by removal of the catalytic element from the crystalline semiconductor film. The technique described in Japanese Patent Application Laid-Open No. Hei 10-135468 or Japanese Patent Application Laid-Open No. Hei 10-135469 is used as the process in Embodiment 3.

The above-stated technique described in these publications is a technique in which the catalytic element used in crystallizing an amorphous semiconductor film is removed by employing a phosphorous gettering effect after crystallization. It is possible to reduce the catalytic element concentration in a crystalline semiconductor film to $1 \times 10^{17}$ atoms/cm$^3$ or less, desirably to $1 \times 10^{16}$ atoms/cm$^3$ by using these techniques.

Figure 8A:
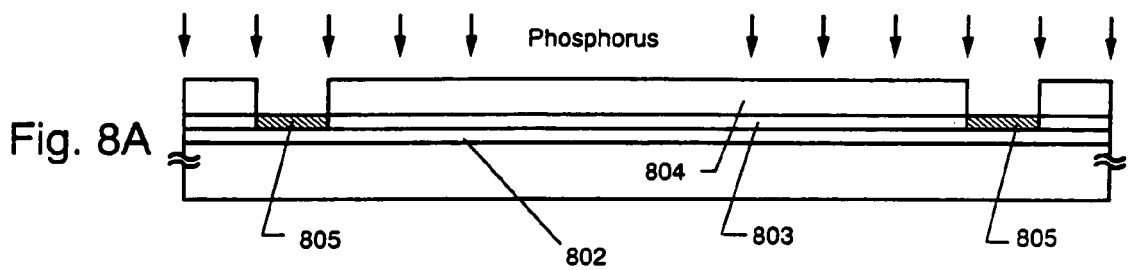
FIGS. 8A and 8B are views showing the manufacturing process of a crystalline silicon film.
Figure 8B:
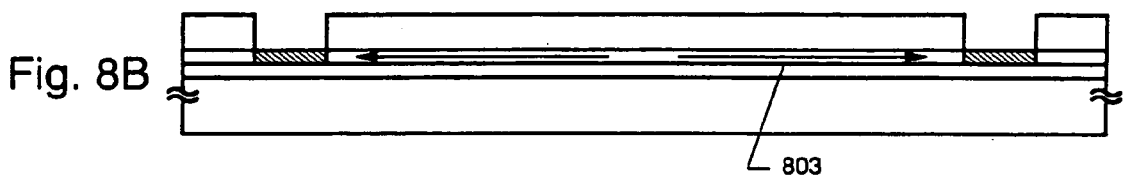

FIGS. 8A and 8B are used to explain the structure of Embodiment 3. A non-alkaline glass substrate represented by a Corning 1737 substrate is used herein. FIG. 8A shows the state where a base film 802 and a crystalline silicon film 803 are formed using the crystallization technique shown in Embodiment 2. Then, a silicon oxide film 804 having a thickness of 150 nm is formed, as a mask, on the surface of the crystalline silicon film 803, and is patterned to form open pore sections, forming regions to which the crystalline semiconductor film 803 is exposed. Then, a phosphorous doping process is performed, forming regions 805 in which phosphorous is doped into the crystalline silicon film.

In this state, if an annealing process is performed in a nitrogen atmosphere at between 550 and 800° C. for between 5 and 24 hours (for 12 hours at 600° C. in Embodiment 3), the regions 805 in the crystalline silicon film that have been doped with phosphorous work as gettering sites. The catalytic element remaining in the crystalline silicon film 803 is able to migrate to the regions 805 that have been doped with phosphorous.

Then, by removing the silicon nitride film 804, used as a mask, and the phosphorous doped regions 805 by etching, the crystalline silicon film having a concentration of the catalytic element used in the crystallization process reduced to $1 \times 10^{17}$ atoms/cm$^3$ or less can be obtained. The crystalline silicon film can be used, as is, for the semiconductor layer on the TFT of the present invention shown in Embodiment 1.

[Embodiment 4]

Figure 9A:
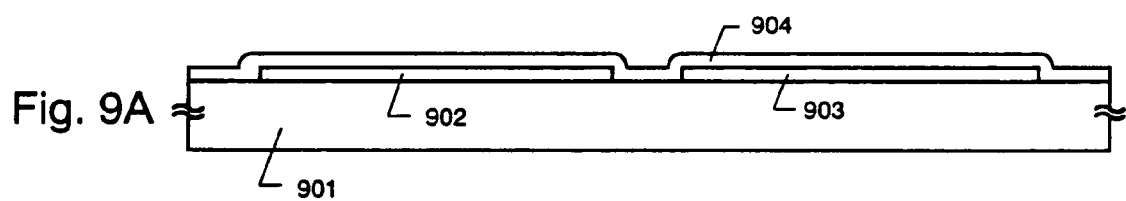
FIGS. 9A and 9B are views showing the manufacturing process of a crystalline silicon film.
Figure 9B:
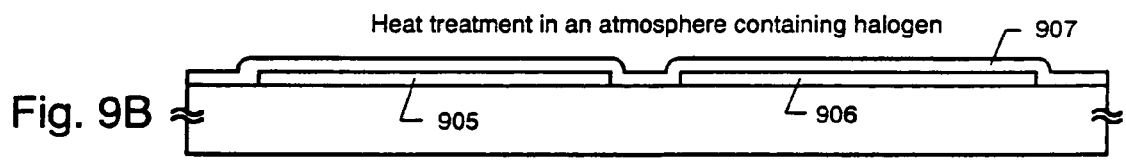

Embodiment 4 shows another embodiment in which the semiconductor layer and gate insulating film are formed according to the manufacturing process for the TFT of the present invention shown in Embodiment 1. The structure of Embodiment 4 is explained by using FIGS. 9A and 9B.

A substrate that has a thermal resistance to an extent of 700 to 1100° C. is required here, so that a quartz substrate 901 is used. The techniques shown in Embodiment 2 and Embodiment 3 are used to form a crystalline semiconductor film. In order to use this film for the TFT semiconductor layer, it is patterned into island shapes to form semiconductor layers 902 and 903. Then, a gate insulating film 904 is formed by a film with silicon as its main component so as to cover the semiconductor layers 902 and 903. In Embodiment 4, an oxidized silicon nitride film is formed by plasma CVD to have a thick of 70 nm. (See FIG. 9A)

Heat treatment is then performed in an atmosphere containing a halogen (typically chlorine) and oxygen. In Embodiment 4, the heat treatment is carried out at 950° C. for 30 minutes. Note that the heating temperature may be chosen in the range of 700 to 1100° C., and that the heating time may be set from 10 minutes to 8 hours. (See FIG. 9B)

With the conditions of Embodiment 4, as a result, a thermal oxidation film is formed at the interface between the semiconductor layers 902, 903 and the gate insulating film 904, forming a gate insulating film 907.

The gate insulating film 907 manufactured through the above processes has a high withstand voltage, and the interface between the semiconductor layers 905, 906 and the gate insulating film 907 is extremely good. Further processing may be followed in accordance with Embodiment 1 in order to obtain the TFT structure of the present invention.

Of course, the user may suitably determine to combine Embodiment 4 with Embodiment 2 or Embodiment 3.

[Embodiment 5]

Figure 14A:
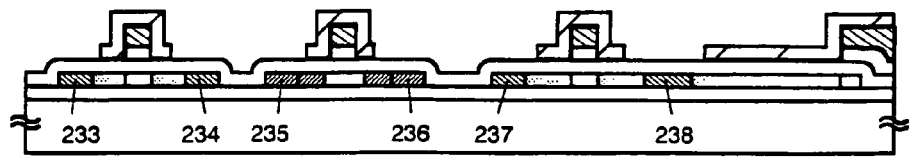
FIGS. 14A and 14B are cross sectional views showing the manufacturing process of a TFT.
Figure 14B:
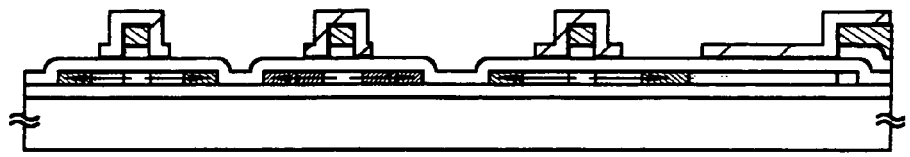

An example of manufacturing a crystalline TFT with a process order differing from Embodiment 1 is shown in FIGS. 14A and 14B. Specifically, an alternative form of the phosphorous gettering process shown in Embodiment 3 is explained. Note that the basic processes are in accordance with FIG. 1A, so that only differing points will be focused upon and explained.

Figure 2E:
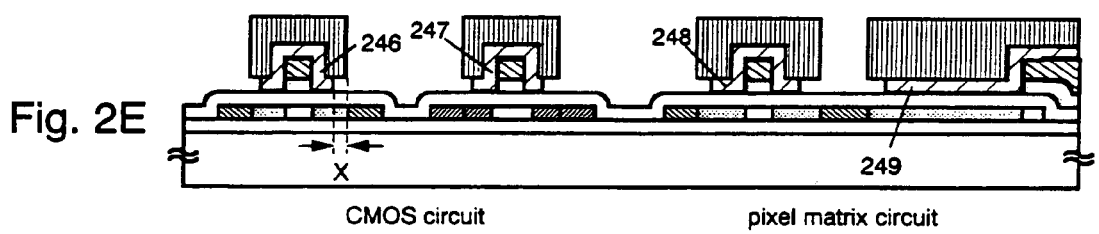

First, the state in FIG. 2E is obtained in accordance with the processes of Embodiment 1. FIG. 14A shows a state corresponding to the state shown in FIG. 2E except that the photoresist films 225 to 228 have been removed. However, the thermal crystallization technique shown in Embodiment 2 is used to form the semiconductor layer that becomes the active layer of the TFT.

At this point, the source regions 233 and 237, and the drain regions 234 and 238 on the n-channel type TFT, and the source region 236 and the drain region 235 on the p-channel type TFT contain phosphorous in a concentration of between $1 \times 10^{19}$ and $1 \times 10^{21}$ atoms/cm$^3$ (preferably $5 \times 10^{20}$ atoms/cm$^3$).

In Embodiment 5, a heating process is performed in this state in a nitrogen atmosphere at 500 to 800° C. for between 1 and 24 hours, for example at 600° C. for 12 hours. The doped impurity elements that impart n-type and p-type conductivity can be activated by this process. In addition, the catalytic element (nickel in Embodiment 5) that remains after the crystallization process migrates in the direction of the arrow, and can be gettered (captured) into the above source regions and drain regions by the phosphorous contained in those regions. As a result, nickel can be reduced to $1 \times 10^{17}$ atoms/cm$^3$ or less in the channel forming region.

An active matrix substrate as shown in FIG. 3B can be manufactured by further processing in accordance with the processes of Embodiment 1, after the process in FIG. 14B is completed.

Note that it is possible to freely combine the structure of Embodiment 5 with the structure of any of Embodiments 1 to 4.

[Embodiment 6]

Figure 15A:
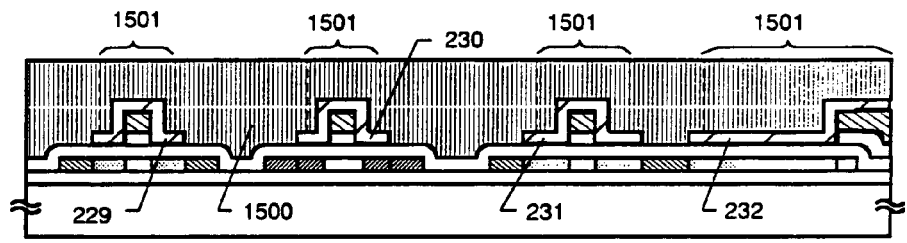
FIGS. 15A and 15B are cross sectional views showing the manufacturing process of a TFT.
Figure 15B:
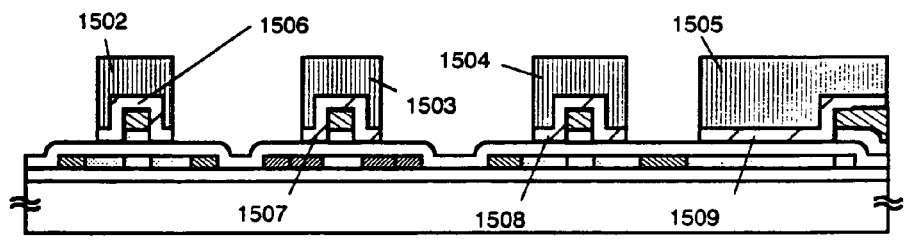

In Embodiment 6, a description will be made of a case where the side etching process shown in FIG. 2E according to Embodiment 1 is performed in a different manner. FIGS. 15A and 15B are used for the explanation.

First, processing is completed through FIG. 2D, in accordance with the processes of Embodiment 1. A photoresist film 1500 is formed, and a portion of the photoresist film 1500 is exposed by light irradiation from the substrate side. A known back side light exposure method may be used for this process.

At this time, non-exposed regions 1501 is formed, using the second gate electrodes 229 to 231 and the capacitor electrode 232 as masks. The non-exposed regions 1501 are formed inside more than the second gate electrodes due to light wraparound. The amount of light wraparound can be controlled by the exposure conditions. The distance (X $\mu$m) shown in FIG. 2E is determined depending upon the amount of wraparound.

Note that in the case of Embodiment 6, the second gate electrodes 229 to 231 and the capacitor electrode 232 must function as masks used for back side light exposure. Therefore, it is necessary to carefully combine the material selection with the back side exposure light source. If the i-line or g-line light used for a normal exposure device, or excimer laser light is used, then a material that absorbs those wavelengths is chosen for use.

The appropriate material differs depending upon the wavelength of light used as the exposure light source, and it is necessary to at least choose a material that is different from the semiconductor layer of the TFT. In Embodiment 6, the semiconductor layer of the TFT is a crystalline silicon film, so that an amorphous silicon film is used as the material for the second gate electrodes.

It is also effective to dope an impurity element into the amorphous silicon film to give it energy band gaps capable of absorbing the exposure light. The impurity element of this type includes an element of phosphorous, boron, carbon, oxygen, nitrogen or the like.

After obtaining the state of FIG. 15A, the photoresist film 1500 is developed, forming patterned photoresist films 1502 to 1505. Then, the second gate electrodes 229 to 231, and the capacitor electrode 232 are etched using the photoresist films 1502 to 1505 as masks.

Second gate electrodes 1506 to 1508, and a capacitor electrode 1509 are newly formed by this etching process. (See FIG. 15B)

Afterward, in accordance with the processes of Embodiment 1, an active matrix substrate with the structure shown in FIG. 3B is completed. It is possible to freely combine the structure of Embodiment 6 with the structure of any of Embodiments 1 to 5.

[Embodiment 7]

In Embodiment 7, a description will be made of the case of manufacturing an active matrix substrate using different processes from those of Embodiment 1. Note that the basic processes are in accordance with FIG. 1A, so that only the differing points will be focused upon and explained.

Figure 16A:
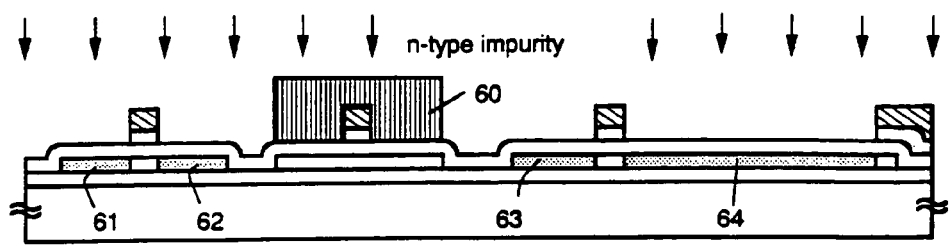
FIGS. 16A to 16D are cross sectional views showing the manufacturing process of a TFT.

First, after obtaining the state of FIG. 2A in accordance with the processes of Embodiment 1, a photoresist film 60 is formed so as to cover the p-channel type TFT. Then, phosphorous is doped under the same condition as in FIG. 2B, forming impurity regions 61 to 64 which become the first impurity regions. (See FIG. 16A)

Figure 16B:
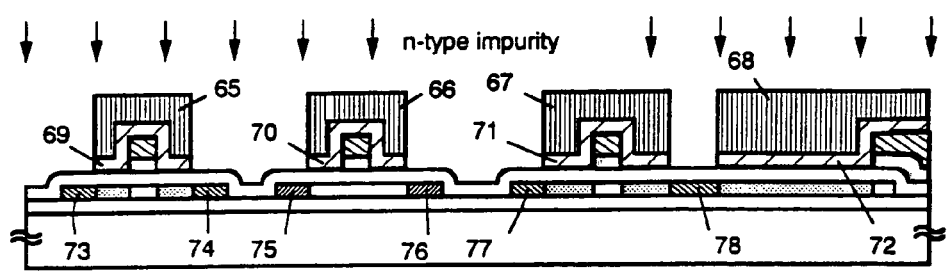

Photoresist films 65 to 68 are formed next by the process shown in FIG. 2D, and in addition, second gate electrodes 69 to 71 and a capacitor electrode 72 are formed. Afterward, phosphorous is doped under the same condition as the process in FIG. 2D, forming impurity regions 73 to 78 with a high concentration of doped phosphorous. (See FIG. 16B)

Figure 16C:
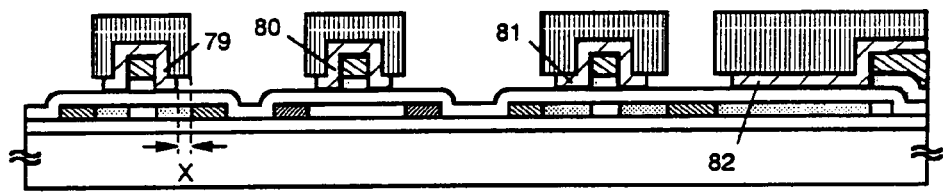

The edge portions of the electrodes are next etched in accordance with the process shown in FIG. 2E, forming second gate electrodes 79 to 81 and a capacitor electrode 82. (See FIG. 16C)

Figure 16D:
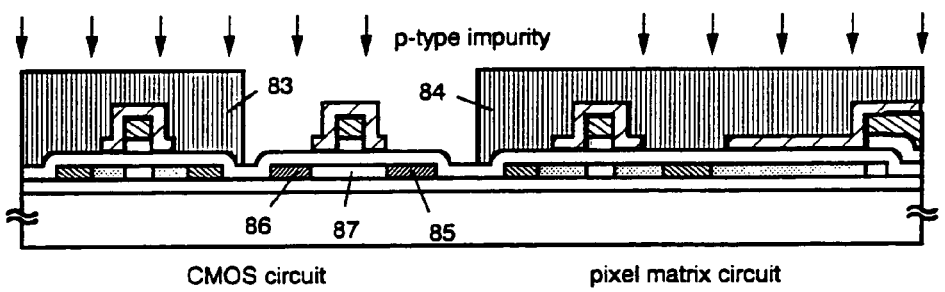

Next, the regions that become the n-channel type TFT are covered with photoresist masks 83 and 84, and boron is doped under the same condition as the process in FIG. 2C. A third impurity region (a source region 85 and a drain region 86) and a channel forming region 87 are defined on the p-channel TFT by this process. (See FIG. 16D)

Afterward, an active matrix substrate with the structure as shown in FIG. 3B is completed in accordance with the processes of Embodiment 1. It is possible to freely combine the structure of Embodiment 7 with the structure of any of Embodiments 2 to 6.

[Embodiment 8]

Embodiment 8 shows an example related to the combination of the first gate electrode and the second gate electrode of Embodiment 1. FIGS. 17A to 17D are used for the explanation.

Figure 17A:
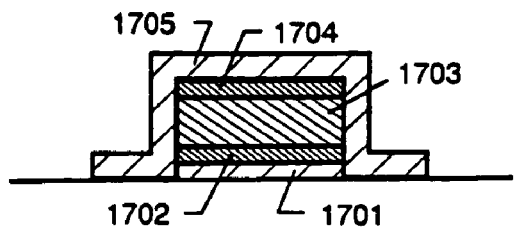
FIGS. 17A to 17D are views showing the structure of a gate electrode.

Referring to FIG. 17A, a conductive silicon film 1701 is used as a first conductive layer, and a titanium (Ti) film 1702. A film with aluminum as its main component (typically, aluminum doped with 0.1 to 5% by weight of titanium, scandium, or niodium) 1703, and a titanium film 1704 are laminated into a laminate film, which is used as a second conducting film. The first conductive layer and the second conductive layer constitute a first gate electrode. Then, a conductive silicon film 1705 is used as a second gate electrode to cover the first gate electrode.

Figure 17B:
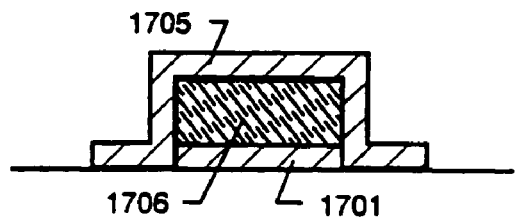

Referring to FIG. 17B, the conductive silicon film 1701 is used as the first conductive layer, and an alloy film 1706 of molybdenum and tungsten in a 1:1 mixture (hereinafter referred to as an Mo—W film 1706) is used as the second conductive layer. The first conductive layer and the second conductive layer constitute the first gate electrode. Then, a conductive silicon film 1705 is used as the second gate electrode to cover the first gate electrode. Note that an Mo—Ta film, in which tungsten is replaced with tantalum, may be substituted for the Mo—W film 1706.

Figure 17C:
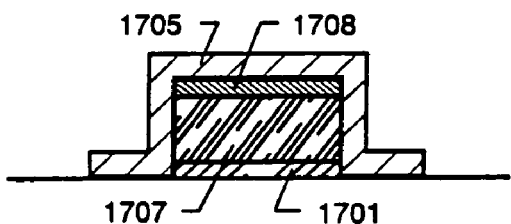

Referring to FIG. 17C, the conductive silicon film 1701 is used as the first conductive layer. A copper film or a film with copper as its main component (typically, a copper film doped with 0.1 to 5% by weight of another element) 1707, and a titanium film 1708 are laminated into a laminate film, which is used as the second conducting film. The first conductive layer and the second conductive layer constitute the first gate electrode. Then, the conductive silicon film 1705 is used as the second gate electrode to cover the first gate electrode.

In this case, it is desirable to contain nitrogen in both of the above conductive silicon films in order to prevent the diffusion of copper. Alternatively, it is also effective to form between the first gate electrode and the second gate electrode, or between the first conductive layer and the second conductive layer a silicon nitride film having a thickness to the extent that it may not impede conduction between the electrodes or between the conductive layers. The film thickness is between 1 and 10 nm (typically 2 to 5 nm) in this case.

Figure 17D:
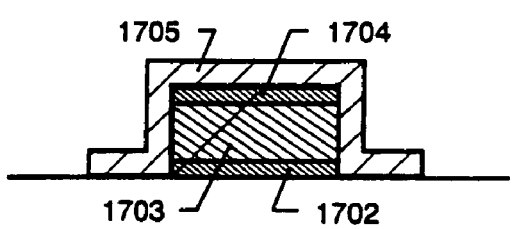

Referring to FIG. 17D, the titanium film 1702 is used as the first conductive layer, and a laminate film of the aluminum as its main component film 1703 and the titanium film 1704 is used as the second conductive layer. The first conductive layer and the second conductive layer constitute the first gate electrode. Then, the conductive silicon film 1705 is used as the second gate electrode to cover the first gate electrode.

The above combinations are typical examples, and combinations that can be applied to the present invention are not to be limited to these examples in Embodiment 8. For example, it is possible to have another structure of FIG. 17D in which the first gate electrode includes a tantalum film at the lower layer and a film with aluminum as its main component at the upper layer.

Further, the conductive silicon films shown in Embodiment 8 are imparted with conductivity by a periodic table group 13 element or group 15 element, but carbon, oxygen, or nitrogen elements may also be doped.

In addition, it is desirable that the first conductive layer be a conductive silicon film, but it is possible to substitute other metallic films (typically a titanium film or a tantalum film). The first conductive layer also serves as a protecting layer for preventing the second conductive layer elements from diffusing into the insulating layer, so that any combination may be available provided that effect is not lost.

Note that it is possible to freely combine the structure of Embodiment 8 with the structure of any of Embodiments 1 to 7.

[Embodiment 9]

Figure 18A:
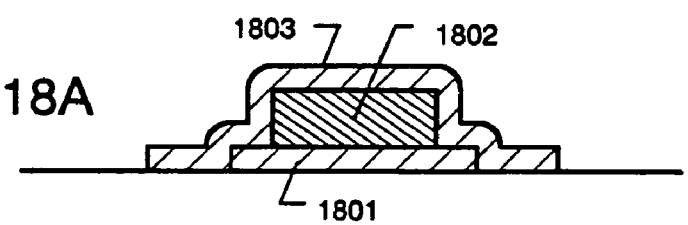
FIGS. 18A and 18B are views showing the structure of a gate electrode.
Figure 18B:
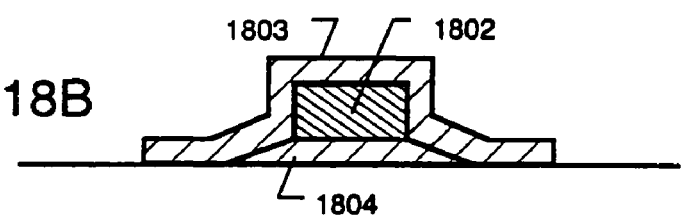

FIGS. 18A and 18B show one example related to the structure of a first gate electrode according to Embodiment 9. In FIG. 18A is shown an example where a conductive silicon film (a first conductive layer) 1801, and a film with aluminum as its main component (a second conductive layer) 1802 are laminated into a laminate film, which is used as a first gate electrode, and where a conductive silicon film 1803 is used as a second gate electrode.

At this time, the first gate electrode can be formed in a stepped shape by making the width of the second conductive layer 1802 narrower than the width of the first conductive layer 1801, as shown in FIG. 18A. By doing so, the coatability of the second gate electrode can be increased, and defects such as breaking of lines can be prevented.

Note that only one step is formed in Embodiment 9, but formation of a number of steps into a multi-step shape is even better.

The shape as shown in FIG. 18A may be formed as follows. After etching the second conductive layer 1802 using a photoresist layer (not shown), by performing over-etching, the side surfaces of the film are etched sideways (side-etched) to form a pattern narrower than the photoresist film. At this point, the above-stated photoresist film remains over the second conductive layer like an umbrella. Using this as is, the conductive silicon film is etched, obtaining the shape shown in FIG. 18A.

Next, the structure shown in FIG. 18B is an example of a case where the conductive silicon film, the first conductive layer in the structure shown in FIG. 18A, is etched into a tapered shape. The conductive silicon film 1801 can be formed into a taper by performing etching using the photoresist film that remains like an umbrella after side etching the second conductive layer 1802, as previously explained in conjunction with FIG. 18A.

The taper angle may be made between 8 and 40° (preferably between 10 and 30°) in this case. Further, it is also effective to form the second conductive layer in the structures of FIGS. 18A and 18B into a tapered shape.

Note that it is possible to freely combine the structure of Embodiment 9 with the structure of any of Embodiments 1 to 8.

[Embodiment 10]

Figure 19:
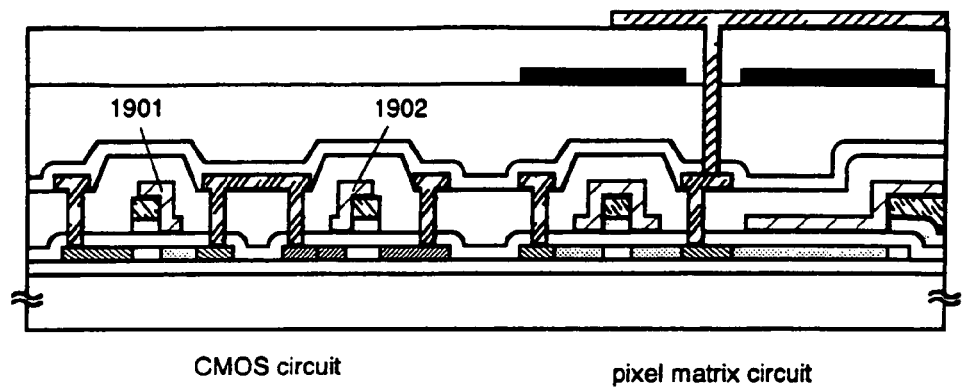
FIG. 19 is a cross sectional view of a pixel section and a CMOS circuit.

In Embodiment 10, FIG. 19 shows an example of the case in which the structure of the LDD region shown in FIG. 1B is only applied to the drain side (the side to which the drain electrode is connected). Only a change in the patterning mask, used when forming the second gate electrode in the process of FIG. 2D of Embodiment 1, is made when implementing Embodiment 10.

As shown in FIG. 19, second gate electrodes 1901 and 1902 are formed to overlap only in the LDD region on the drain side. Thus, there is no LDD region formed on the source side (the side to which the source electrode is connected).

Furthermore, there may be cases in which the functions of the source region and the drain region become reversed in the pixel TFT used in the pixel section, so that it is desirable not to employ the structure of Embodiment 10.

Note that it is possible to freely combine the structure of Embodiment 10 with the structure of any of Embodiments 1 to 9.

[Embodiment 11]

Figure 20A:
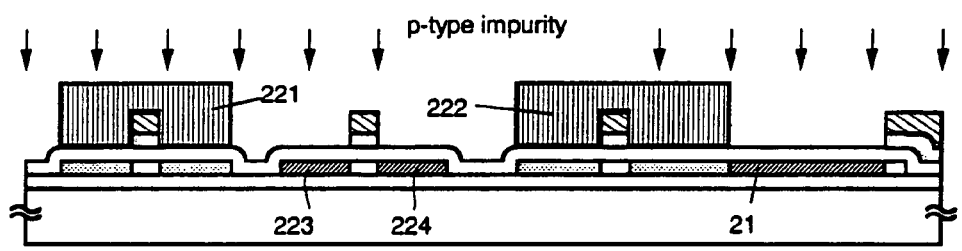
FIGS. 20A and 20B are cross sectional views showing the manufacturing process for supplemental capacitance.
Figure 20B:
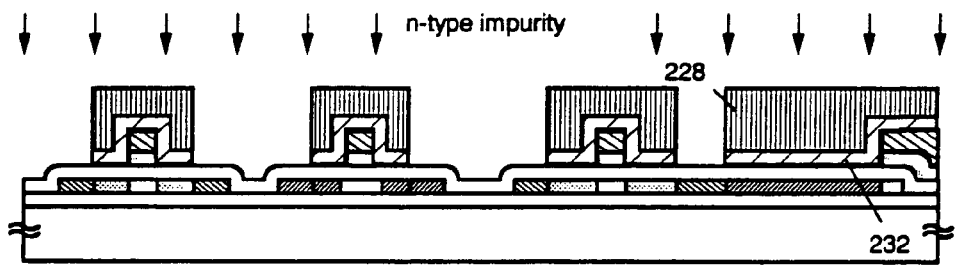

In Embodiment 11, a description will be made of a case in which the impurity region that functions as the lower electrode on the supplemental capacitor in the pixel section is formed after doping with a p-type imparting impurity element. FIGS. 20A and 20B are used for the explanation.

FIG. 20A is a process corresponding to the process of FIG. 2C of Embodiment 1, with a differing shape of the photoresist film 222. Namely, in Embodiment 11, the photoresist film 222 is formed not to overlap the supplemental capacitive section.

By doping boron in this state, an impurity region 21 is formed with the same concentration as in the third impurity regions 223 and 224, which is doped with boron. In Embodiment 11, the impurity region 21 is also called a capacitor electrode (lower electrode).

Next, the process shown in FIG. 2D is performed in accordance with Embodiment 1, and a capacitor electrode (upper electrode) 232 is formed at the same time as the second gate electrode.

Thus, the supplemental capacitor is formed of the capacitor electrode (lower electrode>21, an insulating film (extending from the gate insulating film), and the capacitor electrode (upper electrode) 232. The supplemental capacitor is connected in series to the pixel TFT.

An active matrix substrate with a structure as shown in FIG. 3B is completed by performing further processes in accordance with Embodiment 1. The only difference from FIG. 3B is that the lower electrode of the supplemental capacitor of formed of a p-type impurity region.

Note that it is possible to freely combine the structure of Embodiment 11 with the structure of any of Embodiments 1 to 10.

[Embodiment 12]

In Embodiment 12, a description will be made in conjunction with FIGS. 21A to 21C of the case where the n+region (the second impurity region) in Embodiment 1 is formed with a different process.

First, processing is performed in accordance with Embodiment 1 until just before the phosphorous doping process shown in FIG. 2D. Then, a side etching process is performed on the second gate electrode before phosphorous is doped, obtaining the state in FIG. 21A. Reference numerals used in FIG. 21A correspond to those used in FIGS. 2D and 2E.

Next, etching of the gate insulating film is performed using the photoresist layers 225 to 228 as masks, forming patterned gate insulating films 31 to 33. A known dry etching method may be used for etching the gate insulating films. An insulating film 34 is a film formed at the same time as the gate insulating films 31 to 33 in this case, but it is not strictly a gate insulating film because it functions as an insulating film for the supplemental capacitor.

The photoresist layers 225 to 228 are removed after obtaining the state in FIG. 21B in this way, and a doping process is performed with an n-type imparting impurity, using the second gate electrodes 246 to 248 and the capacitor electrode (upper electrode) 249 as masks. Phosphorous is used as the n-type imparting impurity in Embodiment 12. (See FIG. 21C)

Thus, the second impurity regions 35 to 38, which function as the source region or the drain region on the n-channel type TFT, and the third impurity regions 39 and 40, which function as the source region or the drain region on the p-channel type TFT, are formed.

Further process may be carried out in accordance with Embodiment 1. The final liquid crystal display device according to Embodiment 12 is nearly the same as that shown in FIG. 3B (the only difference is whether or not the gate insulating films are patterned), so that the explanation is omitted here.

Note that it is also effective to perform a known silicide forming process after forming the impurity regions 35 to 40, to make the areas near the surface of, or the entire surface of, the impurity regions 35 to 40 into silicides. Although not shown in the figure, in Embodiment 12, after the process in FIG. 21C, a cobalt film is formed, then forming a cobalt silicide layer.

Thus, it is possible to reduce the contact resistance between the TFT and the wirings. Furthermore, the areas near the surfaces of the second gate electrodes (or the entire surfaces) are made into silicides, making it possible to make them low resistance and to improve their functions as gate electrodes. This also has the advantage that the contact resistance can be reduced when ohmic connections is made between the gate electrodes and other wirings.

Note that it is possible to freely combine the structure of Embodiment 12 with the structure of any of Embodiments 1 to 11.

[Embodiment 13]

In Embodiment 13, a description will be made in conjunction with FIG. 22 of a case where the lengths corresponding to L4 in FIG. 11 are made different in the TFT forming section and the wiring section.

In FIG. 22, a first gate wiring 42 (including a first gate electrode) and a second gate wiring 43 (including a second gate electrode) are formed on a semiconductor layer 41. At this point, the second gate wiring 43 is formed to cover the first gate wiring 42, and throughout this specification, the length of the portion that does not overlap the first gate wiring 42 is defined as L4. (See FIG. 11)

In Embodiment 13, the length of L4 (expressed by $W_{LDD}$ here) in the TFT forming section (on the semiconductor layer) is from 0.1 to 2 $\mu$m (typically from 0.3 to 1.5 $\mu$m). The length of L4' (expressed by $W_L$ here) in the wiring section (other than on the semiconductor layer) is 0.05 to 0.5 $\mu$m (typically from 0.1 to 0.3 $\mu$m).

In other words, Embodiment 13 is characterized in that the line width of the second gate wiring is narrower in the wiring forming section than in the TFT forming section. This is because the region corresponding to L4 is not necessary in the wiring forming section, which may be the main factor to prevent high density integration on the contrary, so that it is desirable to make the line width as narrow as possible.

Therefore, it becomes easy for high density integration of the wiring by using the structure of Embodiment 13, leading to high density integration of the semiconductor device. Note that it is possible to freely combine the structure of Embodiment 13 with the structure of any of Embodiments 1 to 12.

[Embodiment 14]

It is possible to use the TFT structure of the present invention not only for electro-optical devices such as liquid crystal display devices, but for all semiconductor circuits. Namely, the present invention may be applied to microprocessors such as RISC processors, ASIC processors, etc., and may also be used from the signal processing circuits of a D/A converter, etc. to the high frequency circuits of mobile equipment (cellular telephones, PHS, mobile computers).

In addition, it is possible to realize a semiconductor device with a three dimensional structure in which an interlayer insulating film is formed on a conventional MOSFET and a semiconductor circuit is then manufactured on top of that by using the present invention. It is thus possible to apply the present invention to all present semiconductor devices in which LSIs are used. Namely, the present invention may be used for SOI structures (TFT structures using a single crystal semiconductor film) such as SIMOX, Smart-Cut (a trademark of SOITEC Co.), and ELTRAN (a trademark of Canon, Inc.).

Furthermore, the semiconductor circuits of Embodiment 14 can be realized by using a structure from any combination of Embodiments 1 to 11.

[Embodiment 15]

This example demonstrates a process for producing an EL (electroluminescence) display device according to the invention of the present application.

Figure 23A:
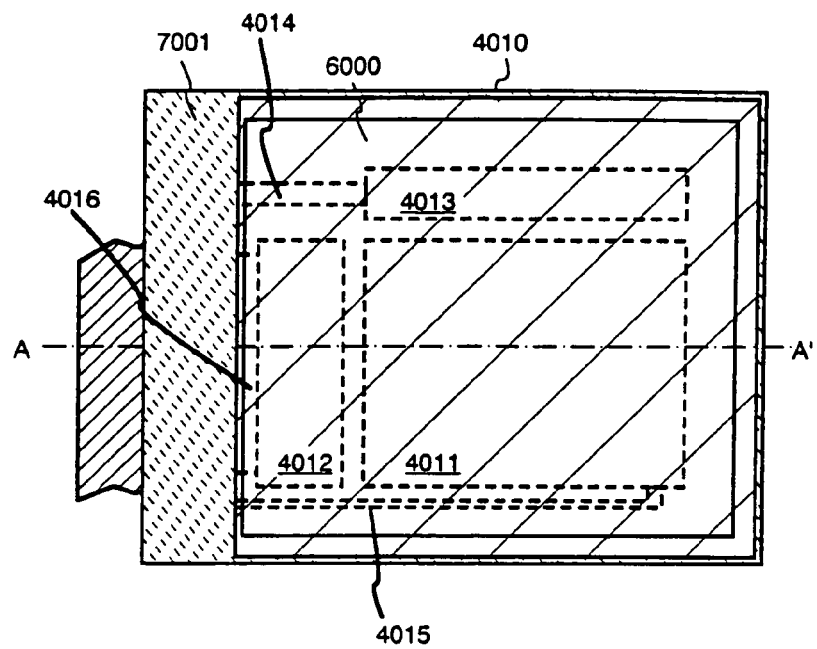
FIGS. 23A and 23B are a top view and a cross sectional view of the structure of an EL display device, respectively.

FIG. 23A is a top view showing an EL display device, which was produced according to the invention of the present application. In FIG. 23A, there are shown a substrate 4010, a pixel part 4011, a driving circuit from the source 4012, and a driving circuit from the gate 4013, each driving circuit connecting to wirings 4014 to 4016 which reach FPC 4017 leading to external equipment.

The pixel part, preferably together with the driving circuit, is enclosed by a covering material 6000, and an end-sealing material (or second sealing material) 7001.

Figure 23B:
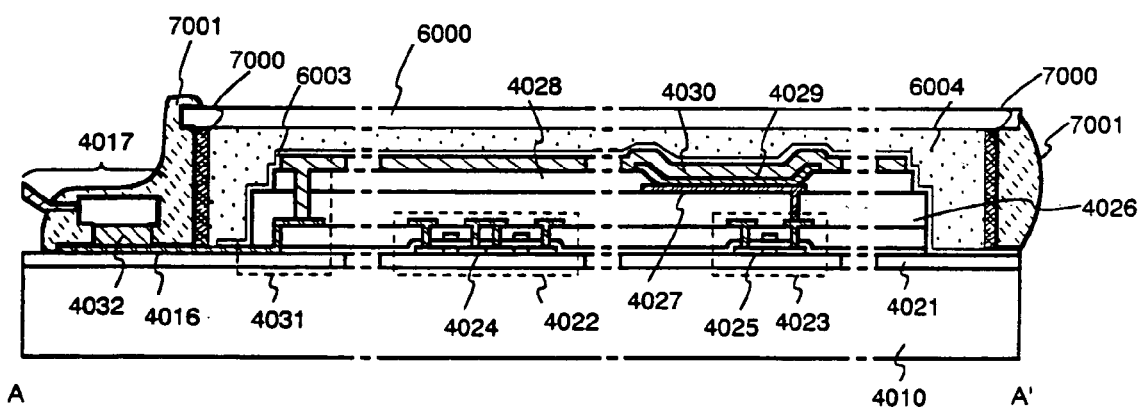

FIG. 23B is a sectional view showing the structure of the EL display device in this Embodiment. There is shown a substrate 4010, an underlying coating 4021, a TFT 4022 for the driving circuit, and a TFT 4023 for the pixel unit. (The TFT 4022 shown is a CMOS circuit consisting of an n-channel type TFT land a p-channel type TFT. The TFT 4023 shown is the one, which controls current to the EL element.) These TFTs may be of any known structure (top gate structure or bottom gate structure).

Incidentally, the present invention is used in the TFT 4022 for the driving circuit and the TFT 4023 for the pixel unit.

Upon completion of TFT 4022 (for the driving circuit) and TFT 4023 (for the pixel unit), with their active layer being the semiconductor layer formed according to the invention of the present application, a pixel electrode 4027 is formed on the interlayer insulating film (planarizing film) 4026 made of a resin. This pixel electrode is a transparent conductive film, which is electrically connected to the drain of TFT 4023 for the pixel unit. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single-layer structure or multi-layer structure by freely combining known EL materials such as injection layer, hole transport layer, light emitting layer, electron transport layer, and electron injection layer. Any known technology may be available for such structure. The EL material is either a low-molecular material or a high-molecular material (polymer). The former may be applied by vapor deposition, and the latter may be applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 consecutively in a vacuum, or by forming the EL layer 4029 in an inert atmosphere and then forming the cathode 4030 in the same atmosphere without admitting air into it. In this Example, the desired film was formed by using a film-forming apparatus of multi-chamber system (cluster tool system).

The multi-layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end-sealing material 7001 is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use sperical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of $\mu$m sandwiched by a PVF film or a Mylar film.

It is noted that the covering material 6000 should have a light transparency with accordance to a light emitting direction (a light radiation direction) from the EL element.

The wiring 4016 is electrically connected to FPC 4017 through the gap between the sealing material 7000 and the end-sealing material 7001, and the substrate 4010. As in the wiring 4016 explained above, other wirings 4014 and 4015 are also electrically connected to FPC 4017 under the sealing material 4018.

[Embodiment 16]

Figure 24A:
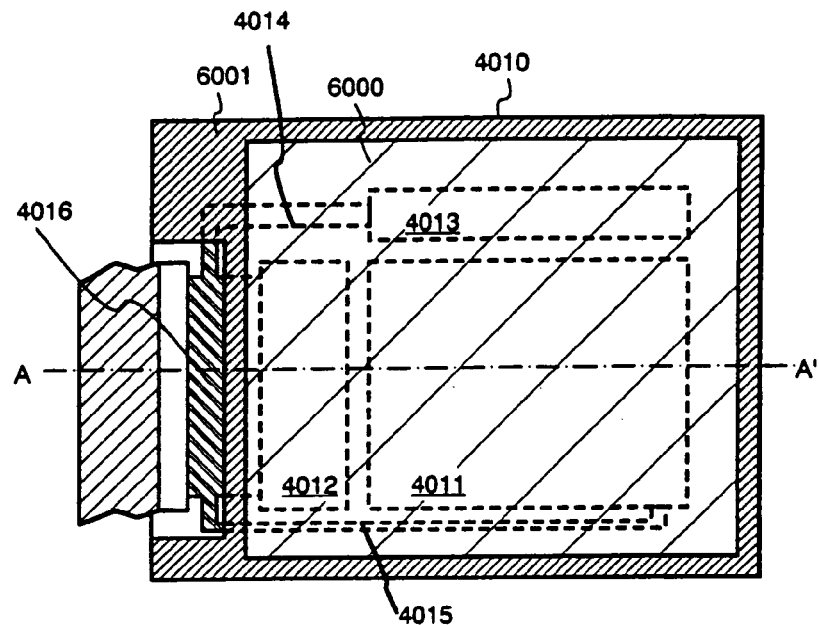
FIGS. 24A and 24B are a top view and a cross sectional view of the structure of an EL display device, respectively.
Figure 24B:
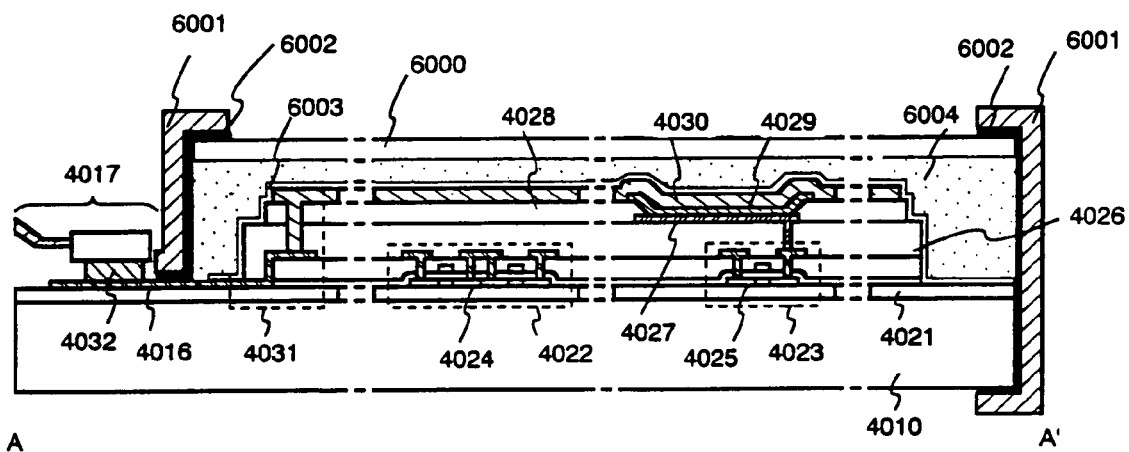

In this embodiment, another EL display device having a different structure from the Embodiment 15 is explained, as shown in FIGS. 24A and 24B. The same reference numerals in FIG. 24A and 24B as in FIGS. 23A and 23B indicate same constitutive elements, so an explanation is omitted.

FIG. 24A shows a top view of the EL module in this embodiment and FIG. 24B shows a sectional view of A–A' of FIG. 24A.

According to Embodiment 15, the passivation film 6003 is formed to cover a surface of the EL element.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use sperical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

Next, the covering material 6000 is adhered using the filling material 3404. Then, the flame material 6001 is attached to cover side portions (exposed faces) of the filling material 6004. The flame material 6001 is adhered by the sealing material (acts as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wirings 4014 and 4015 are also electrically connected to FPC 4017 under the sealing material 6002.

[Embodiment 17]

Figure 25:
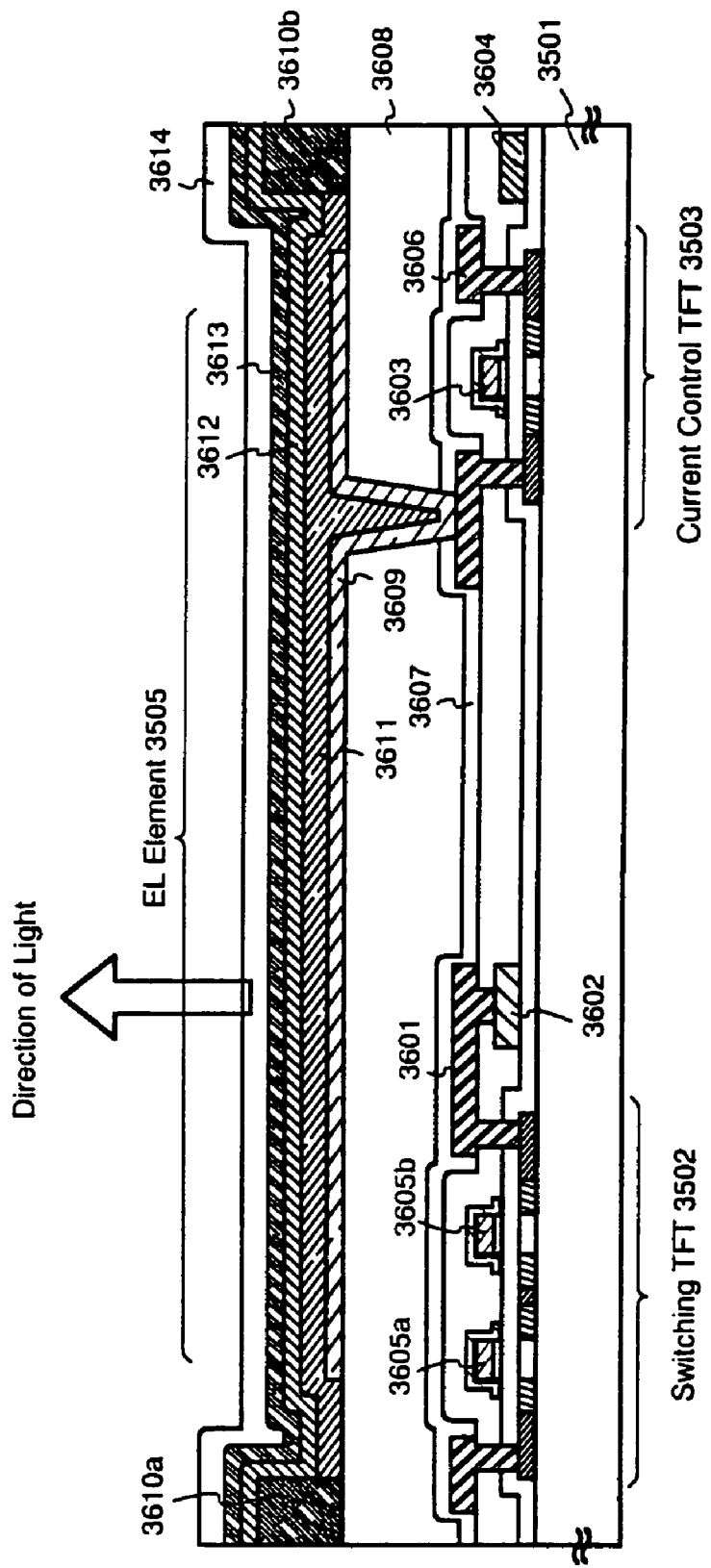
FIG. 25 is a cross sectional view of the structure of an EL display device.
Figure 26A:
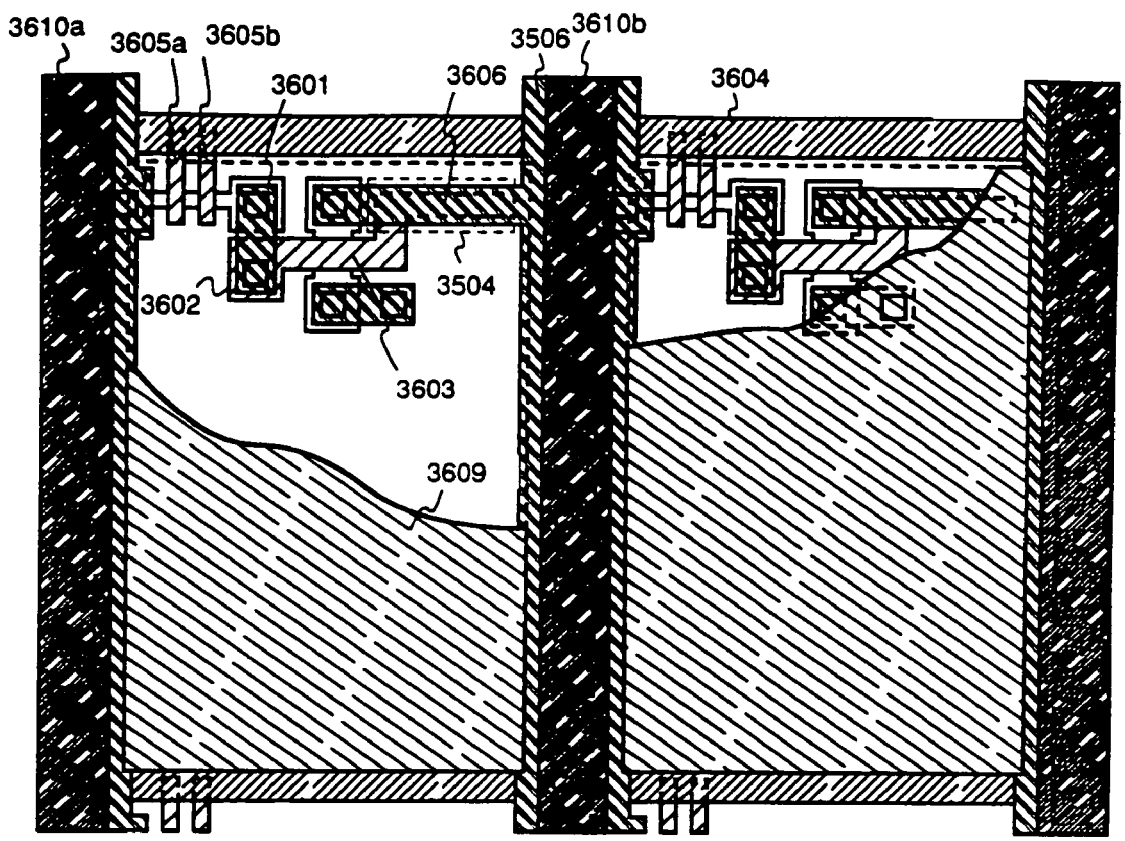
FIGS. 26A and 26B are top view of the structure of an EL display device and the circuit, respectively.
Figure 26B:
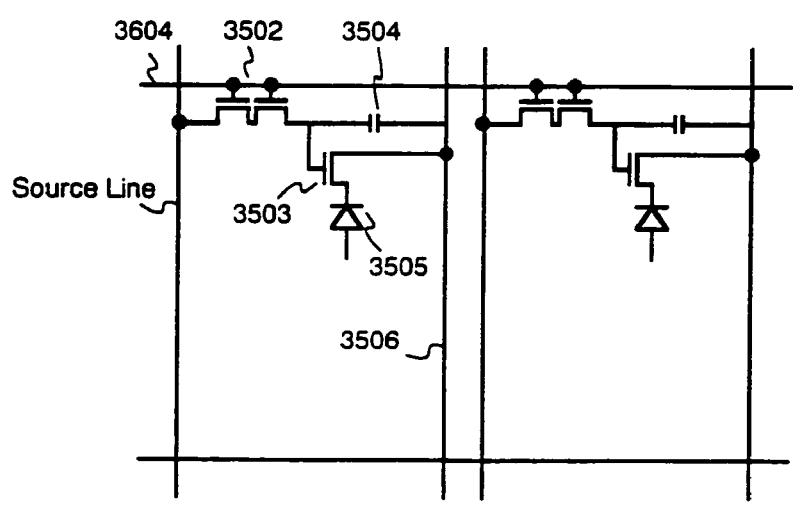

In the EL display device having a structure based on the Embodiment 15 or 16, the present invention can be used. In this embodiment, the structure of the pixel region in the panel is illustrated in more detail. FIG. 25 shows the cross section of the pixel region; FIG. 26A shows the top view thereof; and FIG. 26B shows the circuit pattern for the pixel region. In FIG. 25, FIG. 26A and FIG. 26B, the same reference numerals are referred to for the same parts, as being common thereto.

In FIG. 25, the switching TFT 3502 formed on the substrate 3501 is NTFT of the invention (cf. Embodiments 1 to 12). In this Embodiment, it has a double-gate structure, but its structure and fabrication process do not so much differ from the structures and the fabrication processes illustrated hereinabove, and their description is omitted herein. However, the double-gate structure of the switching TFT 3502 has substantially two. TFTs as connected in series, and therefore has the advantage of reducing the off-current to pass therethrough. In this Embodiment, the switching TFT 3502 has such a double-gate structure, but is not limitative. It may have a single-gate structure or a triple-gate structure, or even any other multi-gate structure having more than three gates. As the case may be, the switching TFT 3502 may be PTFT of the invention.

The current-control TFT 3503 is NTFT of the invention. The drain wire 3601 in the switching TFT 3502 is electrically connected with the gate electrode 3603 in the current-control TFT, via the wire 3602 therebetween. The wire indicated by 3604 is a gate wire for electrically connecting the gate electrodes 3605a and 3605b in the switching TFT 3502.

It is very important that the current-control TFT 3503 has the structure defined in the invention. The current-control TFT is a unit for controlling the quantity of current that passes through the EL device. Therefore, a large quantity of current passes through it, and the unit, current-control TFT has a high risk of thermal degradation and degradation with hot carriers. To this unit, therefore, the structure of the invention is extremely favorable, in which an LDD region is so constructed that the gate electrode overlaps with the drain area in the current-control TFT, via a gate-insulating film therebetween.

In this Embodiment, the current-control TFT 3503 is illustrated to have a single-gate structure, but it may have a multi-gate structure with plural TFTs connected in series. In addition, plural TFTs may be connected in parallel so that the channel-forming region is substantially divided into plural sections. In the structure of that type, heat radiation can be effected efficiently. The structure is advantageous for protecting the device with it from thermal deterioration.

As in FIG. 26A, the wire to be the gate electrode 3603 in the current-control TFT 3503 overlaps with the drain wire 3606 therein in the region indicated by 3504, via an insulating film therebetween. In this state, the region indicated by 3504 forms a capacitor. The capacitor 3504 functions to retain the voltage applied to the gate in the current-control TFT 3503. The drain wire 3606 is connected with the current supply line (power line) 3506, from which a constant voltage is all the time applied to the drain wire 3606.

On the switching TFT 3502 and the current-control TFT 3503, formed is a first passivation film 3607. On the film 3607, formed is a planarizing film 3608 of an insulating resin. It is extremely important that the difference in level of the layered parts in TFT is removed through planarization with the planarizing film 3608. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 3609 indicates a pixel electrode (a cathode in the EL device) of an electroconductive film with high reflectivity. The pixel electrode 43 is electrically connected with the drain in the current-control TFT 3503. It is preferable that the pixel electrode 3609 is of a low-resistance electroconductive film of an aluminium alloy, a copper alloy or a silver alloy, or of a laminate of those films. Needlessto-say, the pixel electrode 3609 may have a laminate structure with any other electroconductive films.

In the recess (this corresponds to the pixel) formed between the banks 3610a and 3610b of an insulating film (preferably of a resin), the light-emitting layer 3611 is formed. In the illustrated structure, only one pixel is shown, but plural light-emitting layers could be separately formed in different pixels, corresponding to different colors of R (red), G (green) and B (blue). The organic EL material for the light-emitting layer may be any π-conjugated polymer material. Typical polymer materials usable herein include polyparaphenylenevinylene (PVV) materials, polyvinylcarbazole (PVK) materials, polyfluorene materials, etc.

Various types of PVV-type organic EL materials are known, such as those disclosed in "H. Shenk, H. Becker, O. Gelsen, E. Klunge, W. Kreuder, and H. Spreitzer; Polymers for Light Emitting Diodes, Euro Display Proceedings, 1999, pp. 33–37" and in Japanese Patent Laid-Open No. 10-92576. Any of such known materials are usable herein.

Concretely, cyanopolyphenylenevinylenes may be used for red-emitting layers; polyphenylenevinylenes may be for green-emitting layers; and polyphenylenevinylenes or polyalkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, this Embodiment is to demonstrate the embodiment of using polymer materials to form light-emitting layers, which, however, is not limitative. Apart from this, low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Embodiment, a hole injection layer 3612 of PEDOT (polythiophene) or PAni (polyaniline) is formed on the light-emitting layer 3611 to give a laminate structure for the EL layer. On the hole injection layer 3612, formed is an anode 3613 of a transparent electroconductive film. In this Embodiment, the light having been emitted by the light-emitting layer 3611 radiates therefrom in the direction toward the top surface (that is, in the upward direction of TFT). Therefore, in this, the anode must transmit light. For the transparent electroconductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent electroconductive film for the anode is of a material capable of being formed into a film at as low as possible temperatures.

When the anode 3613 is formed, the EL device 3505 is finished. The EL device 3505 thus fabricated herein indicates a capacitor comprising the pixel electrode (cathode) 3609, the light-emitting layer 3611, the hole injection layer 3612 and the anode 3613. As in FIG. 36A, the region of the pixel electrode 3609 is nearly the same as the area of the pixel. Therefore, in this, the entire pixel functions as the EL device. Accordingly, the light utility efficiency of the EL device fabricated herein is high, and the device can display bright images.

In this Embodiment, a second passivation film 3614 is formed on the anode 3613. For the second passivation film 3614, preferably used is a silicon nitride film or a silicon oxynitride film. The object of the film 3614 is to insulate the EL device from the outward environment. The film 3614 has the function of preventing the organic EL material from being degraded through oxidation and has the function of preventing it from degassing. With the second passivation film 3614 of that type, the reliability of the EL display device is improved.

As described hereinabove, the EL display panel of the invention fabricated in this Embodiment has a pixel region for the pixel having the constitution as in FIG. 25, and has the switching TFT through which the off-current to pass is very small to a satisfactory degree, and the current-control TFT resistant to hot carrier injection. Accordingly, the EL display panel fabricated herein has high reliability and can display good images.

The constitution of this Embodiment can be combined with any constitution of Embodiments 1 to 12 in any desired manner. Incorporating the EL display panel of this Embodiment into the electronic appliance of subsequent Embodiment 21as its display part is advantageous.

[Embodiment 18]

This Embodiment is to demonstrate a modification of the EL display panel of Embodiment 17, in which the EL device 3505 in the pixel region has a reversed structure. For this Embodiment, referred to is FIG. 27. The constitution of the EL display panel of this Embodiment differs from that illustrated in FIG. 26A only in the EL device part and the current-control TFT part. Therefore, the description of the other parts except those different parts is omitted herein.

Figure 27:
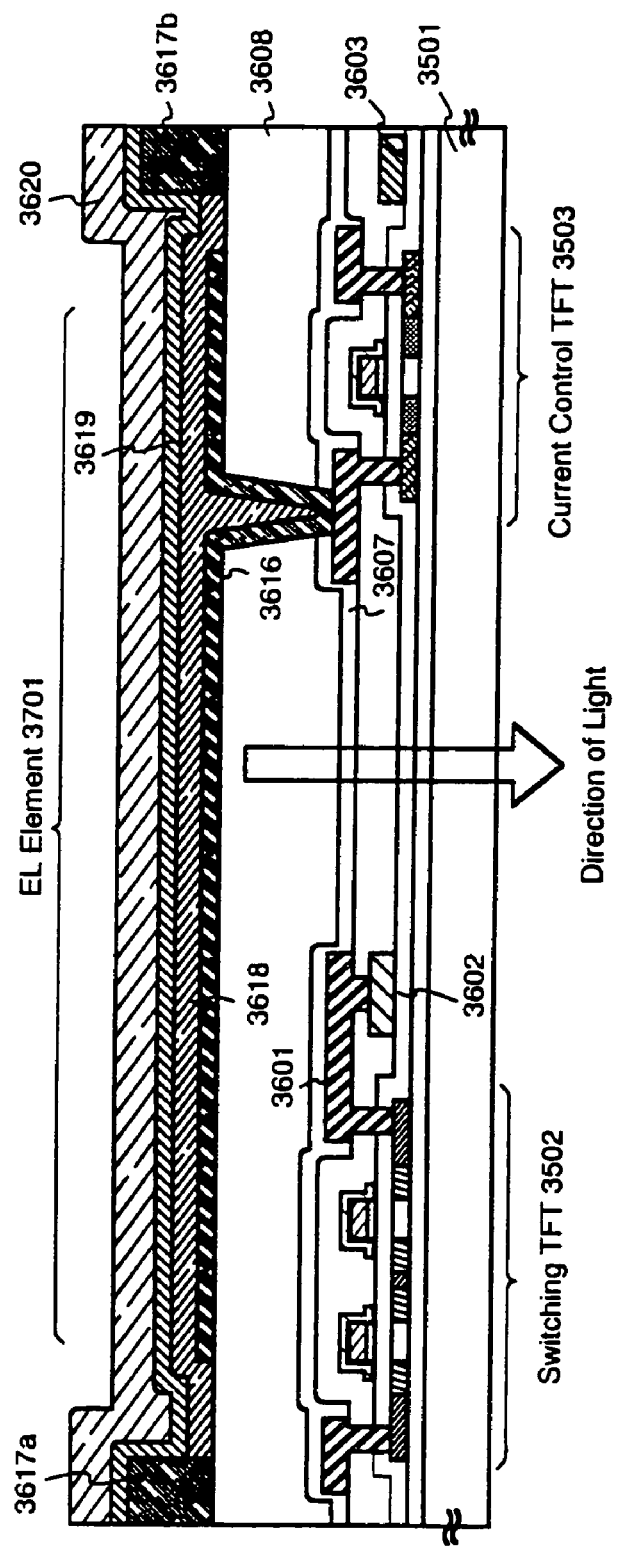
FIG. 27 is a cross sectional view of the structure of an EL display device.

In FIG. 27, the current-control TFT 3701 may be PTFT of the invention. For the process of forming it, referred to is that of Embodiment 1 to 12.

In this Embodiment, the pixel electrode (anode) 3616 is of a transparent electroconductive film. Concretely, used is an electroconductive film of a compound of indium oxide and zinc oxide. Needless-to-say, also usable is an electroconductive film of a compound of indium oxide and tin oxide.

After the banks 3617a and 3617b of an insulating film have been formed, a light-emitting layer 3618 of polyvinylcarbazole is formed between them in a solution coating method. On the light-emitting layer 3618, formed are an electron injection layer 3619 of acetylacetonatopotassium (hereinafter acacK), and a cathode 3620 of an aluminium alloy. In this case, the cathode 3620 serves also as a passivation film. Thus is fabricated the EL device 3701.

In this Embodiment, the light having been emitted by the light-emitting layer 3618 radiates in the direction toward the substrate with TFT formed thereon, as in the direction of the arrow illustrated.

The constitution of this Embodiment can be combined with any constitution of Embodiments 1 to 12 in any desired manner. Incorporating the EL display panel of this Embodiment into the electronic appliance of subsequent Embodiment 21as its display part is advantageous.

[Embodiment 19]

This Embodiment is to demonstrate modifications of the pixel with the circuit pattern of FIG. 26B. The modifications are as in FIG. 28A to FIG. 28C. In this Embodiment illustrated in those FIG. 28A to FIG. 28C, 3801 indicates the source wire for the switching TFT 3802; 3803 indicates the gate wire for the switching TFT 3802; 3804 indicates a current-control TFT; 3805 indicates a capacitor; 3806 and 3808 indicate current supply lines; and 3807 indicates an EL device.

Figure 28A:
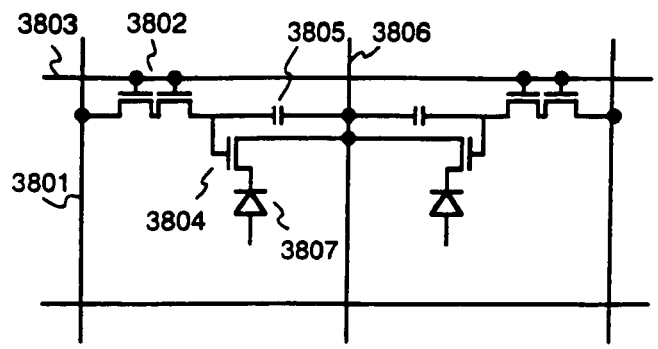
FIGS. 28A to 28C are views showing the circuits of an EL display device.

In the embodiment of FIG. 28A, the current supply line 3806 is common to the two pixels. Specifically, this embodiment is characterized in that two pixels are lineal-symmetrically formed with the current supply line 3806 being the center between them. Since the number of current supply lines can be reduced therein, this embodiment is advantageous in that the pixel pattern can be much finer and thinner.

Figure 28B:
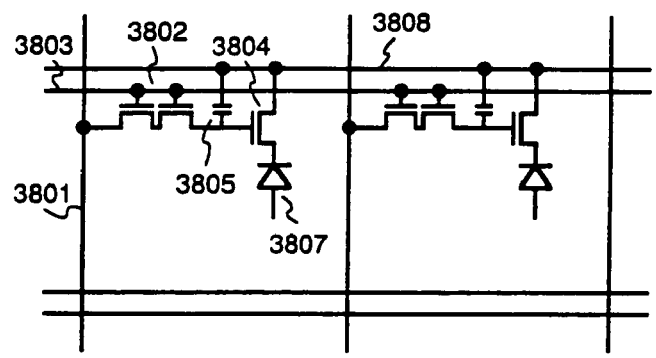

In the embodiment of FIG. 28B, the current supply line 3808 is formed in parallel to the gate wire 3803. Specifically, in this, the current supply line 3808 is so constructed that it does not overlap with the gate wire 3803, but is not limitative. Being different from the illustrated case, the two may overlap with each other via an insulating film therebetween so far as they are of different layers. Since the current supply line 3808 and the gate wire 3803 may enjoy the common exclusive area therein, this embodiment is advantageous in that the pixel pattern can be much finer and thinner.

Figure 28C:
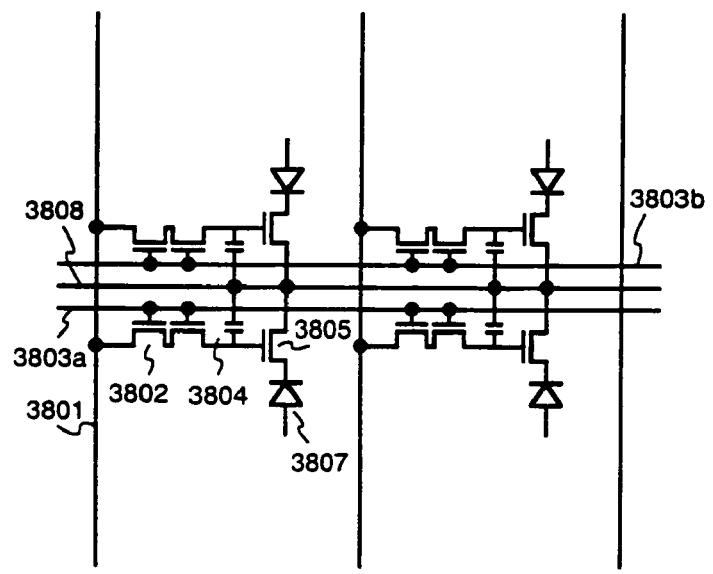

The structure of the embodiment of FIG. 28C is characterized in that the current supply line 3808 is formed in parallel to the gate wires 3803, like in FIG. 28B, and that two pixels are lineal-symmetrically formed with the current supply line 3808 being the center between them. In this, it is also effective to provide the current supply line 3808 in such a manner that it overlaps with any one of the gate wires 3803. Since the number of current supply lines can be reduced therein, this embodiment is advantageous in that the pixel pattern can be much finer and thinner.

The constitution of this Embodiment can be combined with any constitution of Embodiment 1 to 12, 15 and 16 in any desired manner. Incorporating the EL display panel having the pixel structure of this Embodiment into the electronic appliance of subsequent Embodiment 21 as its display part is advantageous.

[Embodiment 20]

The embodiment of Embodiment 17 illustrated in FIG. 26A and FIG. 26B is provided with the capacitor 3504 which acts to retain the voltage applied to the gate in the current-control TFT 3503. In the embodiment, however, the capacitor 3504 may be omitted.

In the embodiment of Embodiment 17, the current-control TFT 3503 is NTFT of the invention, as shown in Embodiments 1 to 12. Therefore, in the embodiment, the LDD region is so formed that it overlaps with the gate electrode via the gate-insulating film therebetween. In the overlapped region, formed is a parasitic capacitance generally referred to as a gate capacitance. The embodiment of this Embodiment is characterized in that the parasitic capacitance is positively utilized in place of the capacitor 3504.

The parasitic capacitance in question varies, depending on the area in which the gate electrode overlaps with the LDD region, and is therefore determined according to the length of the LDD region in the overlapped area.

Also in the embodiments of Embodiment 19 illustrated in FIG. 28A, FIG. 28B and FIG. 28C, the capacitor 3805 can be omitted.

The constitution of this Embodiment can be combined with any constitution of Embodiment 1 to 12, 15 to 19 in any desired manner. Incorporating the EL display panel having the pixel structure of this Embodiment into the electronic appliance of subsequent Embodiment 21 as its display part is advantageous.

[Embodiment 21]

A TFT formed through carrying out the present invention may be applied to various electro-optical devices and semiconductor circuits. Namely, the present invention may be applicable to all the electronic equipment that incorporates those electro-optical devices or semiconductor circuits as components.

As such an electronic equipment, a video camera, a digital camera, a projector, a projection television, a goggle-type display (head mount display), a navigation system for vehicles, a sound reproduction device, a note-type personal computer, game equipment, a portable information terminal (a mobile computer, a cellular phone, a handheld game unit, or an electronic book, etc.), and an image reproduction device equipped with recording medium (specifically, a device equipped with a display capable of playing back recording medium such as compact disk (CD), laser disk (LD) or digital video disk (DVD) to display the image stored therein) may be enumerated. Examples of those are shown in FIGS. 12A to 12F and FIGS. 24A to 24D.

Figure 12A:
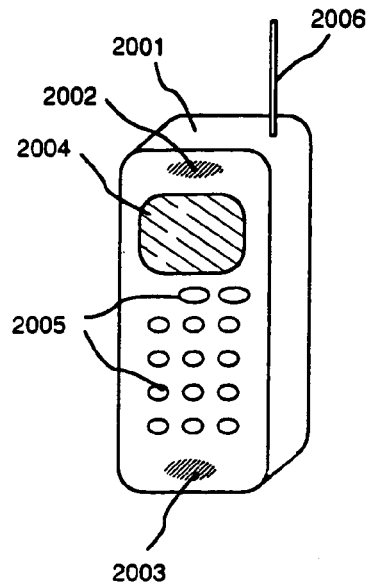
FIGS. 12A to 12F are views showing examples of electronic equipment.

FIG. 12A shows a cellular telephone, comprising a main body 2001, a sound output section 2002, a sound input section 2003, a display device 2004, operation switches 2005, and an antenna 2006. The electro-optical device according to the present invention can be applied to the sound output section 2002, the sound input section 2003 or a CPU, a memory storage, and the like.

Figure 12B:
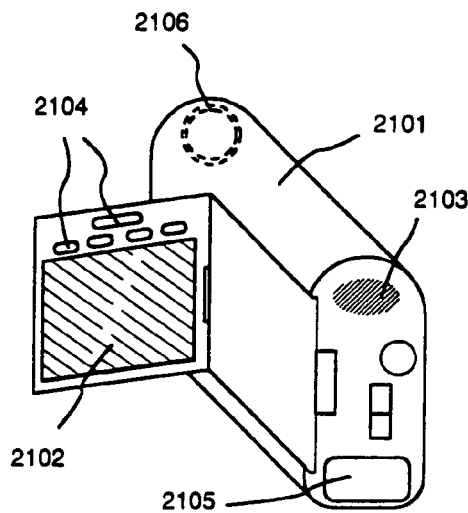

FIG. 12B shows a video camera, comprising a main body 2101, a display device 2102, a voice input unit 2103, operation switches 2104, a battery 2105, and an image receiving unit 2106. The electro-optical device according to the present invention can be applied to the display device 2102, and the semiconductor circuit according to the present invention can be applied to the voice input unit 2103 or a CPU, a memory storage, and the like.

Figure 12C:
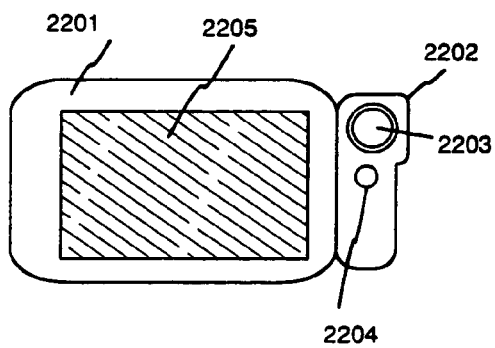

FIG. 12C shows a mobile computer, comprising a main body 2201, a camera unit is 2202, an image receiving unit 2203, an operation switch 2204, and a display device 2205. The electro-optical device according to the present invention can be applied to the display device 2205, and the semiconductor circuit according to the present invention can be applied to a CPU, a memory storage, and the like.

Figure 12D:
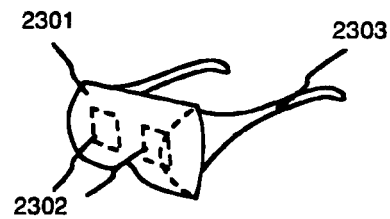

FIG. 12D shows a goggle-type display, comprising a main body 2301, a display device 2302 and an arm portion 2303. The electro-optical device according to the present invention can be applied to the display device 2302, and the semiconductor circuit according to the present invention can be applied to a CPU, a memory storage, and the like.

Figure 12E:
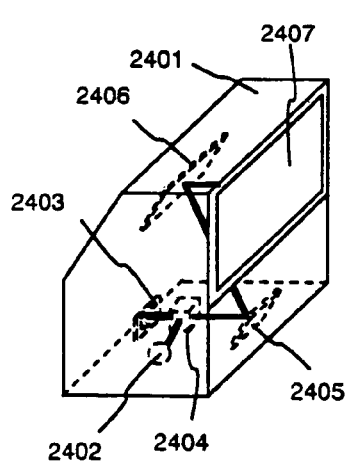

FIG. 12E shows a rear-type projector (projection television), comprising a main body 2401, a light source 2402, an electro-optical device 2403, a polarization beam splitter 2404, reflectors 2405, 2406, and a screen 2407. The electro-optical device according to the present invention can be applied to the electro-optical device 2403, and the semiconductor circuit according to the present invention can be applied to a CPU, a memory storage, and the like.

Figure 12F:
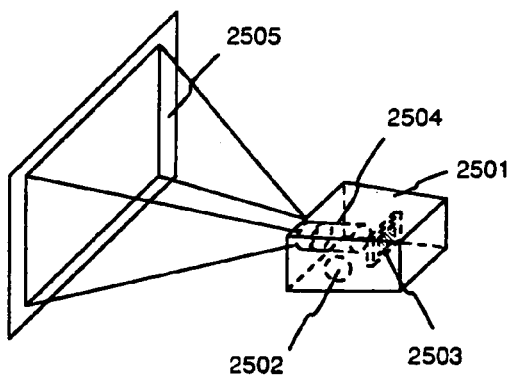

FIG. 12F shows a front-type projector, comprising a main body 2501, a light source 2502, an display device 2503, an optical system 2504, and a screen 2505. The electro-optical device according to the present invention can be applied to the display device 2503, and the semiconductor circuit according to the present invention can be applied to a CPU, a memory storage, and the like.

Figure 29A:
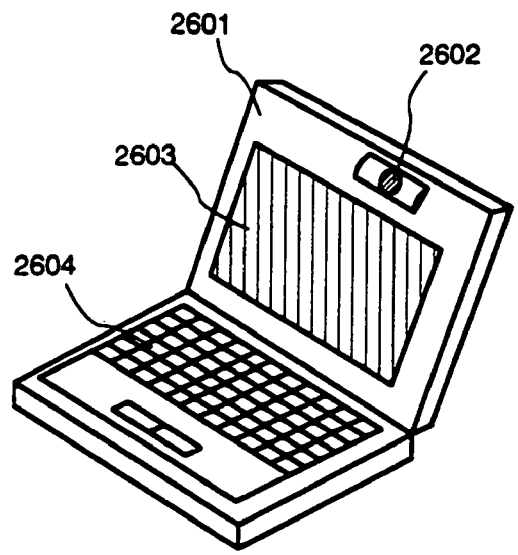
FIGS. 29A to 29D are views showing examples of electronic equipment.

FIG. 29A shows a personal computer, comprising a main body 2601, an image inputting unit 2602, a display device 2603, and a key board 2604. The electro-optical device according to the present invention can be applied to the display device 2603, and the semiconductor circuit according to the present invention can be applied to a CPU, a memory storage, and the like.

Figure 29B:
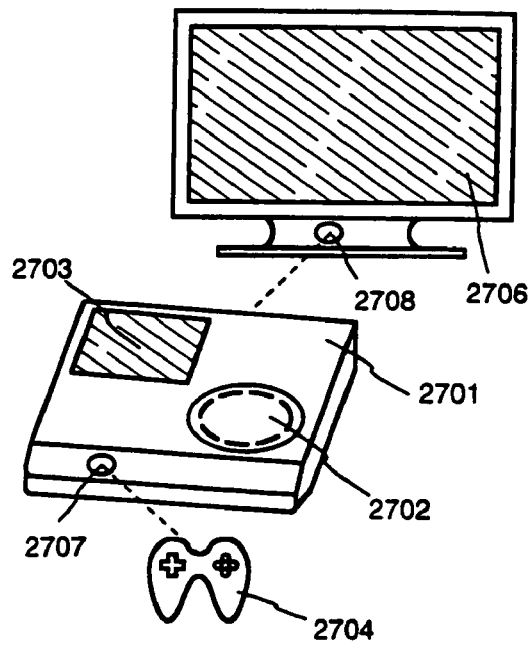

FIG. 29B shows an electronic game player (game equipment), comprising a main body 2701, a recording medium 2702, a display device 2703, and a controller 2704. The image output from the electronic game player is reproduced on a display unit including a display device 2706. A communication means between the controller 2704 and the main body 2701 or a communication means between the electronic game player and the display unit may be implemented in a wired communication, a radio communication or an optical communication. In Embodiment 16, an infrared detection is carried out by sensor units 2707, 2708. The electro-optical device according to the present invention can be applied to the display devices 2703, 2706, and the semiconductor circuit according to the present invention can be applied to a CPU, a memory storage, and the like.

Figure 29C:
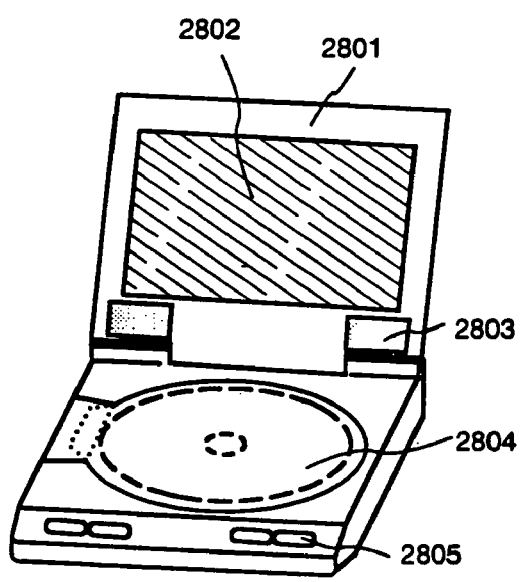

FIG. 29C shows a player (image reproduction device) that employs a recoding medium in which programs are recorded (hereinafter referred to as recording medium), and comprises a main body 2801, a display device 2802, a speaker unit 2803, a recording medium 2804, and operation switches 2805. Incidentally, this image reproduction device uses as the recoding medium a DVD (digital versatile disc), a CD and the like to serve as a tool for enjoying music or movies, for playing games and for connecting to the Internet. The present invention can be applied to the display device 2802, a CPU, a memory storage, and the like.

Figure 29D:
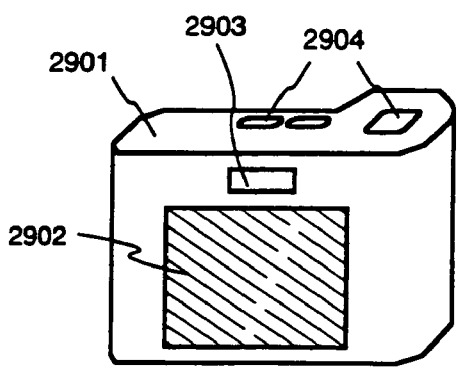

FIG. 29D shows a digital camera, comprising a main body 2901, a display device 2902, an eye piece section 2903, operation switches 2904, and an image receiving unit (not shown). The present invention can be applied to the display device 2902, a CPU, a memory storage, and the like.

Figure 30A:
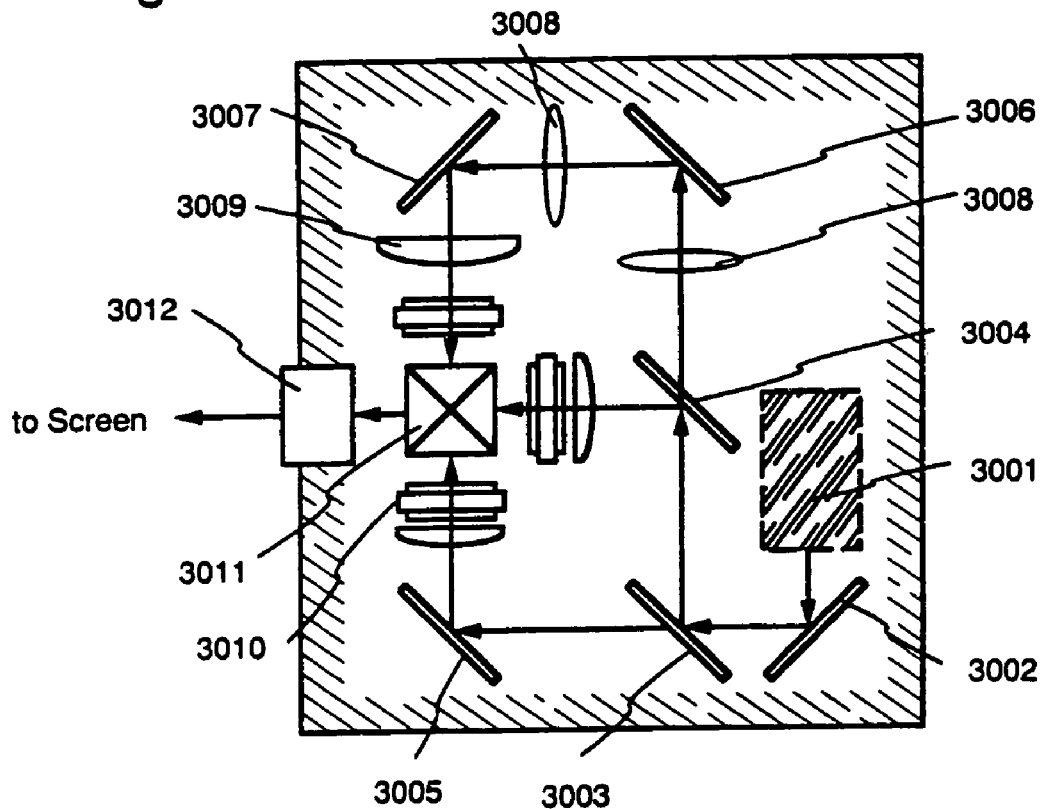
FIGS. 30A and 30B are views showing the structure of an optical engine.

A description of an optical engine will be made in detail with reference to FIGS. 30A and 30B, which can be utilized in the rear-type projector shown in FIG. 12E or the front-type projector shown in FIG. 12F. FIG. 30A shows an optical engine, and FIG. 30B shows an optical light source system built in the optical engine.

The optical engine shown in FIG. 30A is composed of an optical system comprising an optical light source system 3001, mirrors 3002 to 3007, dichroic mirrors 3003 and 3004, optical lenses 3008, 3009, a prism 3011, a liquid crystal display device 3010, and an optical projection system 3012. The optical projection system 3012 is composed of an optical system provided with a projection lens. Embodiment 16 shows an example in which the liquid crystal display device 3010 is triple stage using three lenses, but there are no special limits and a simple stage is acceptable, for example. Further, the operator may set optical systems such as optical lenses, polarizing film, film to regulate the phase difference, or IR films, etc., suitably within the optical path shown by an arrow in FIG. 30A.

Figure 30B:
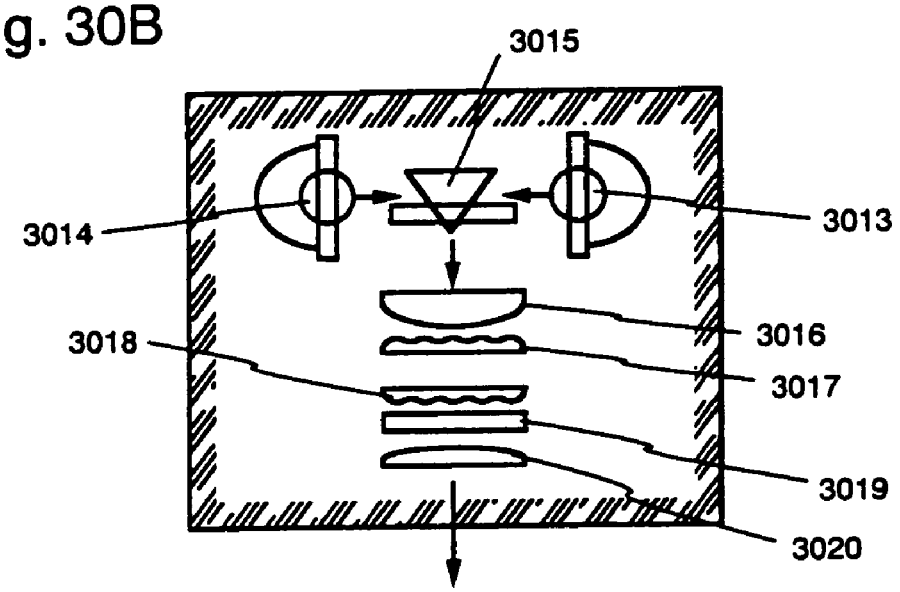

In addition, as shown in FIG. 30B, the optical light source system 3001 is composed of light sources 3013 and 3014, a compound prism 3015, collimator lenses 3016 and 3020, lens arrays 3017 and 3018, and a polarizing conversion element 3019. Note that the optical light source system shown in FIG. 30B uses two light sources, but three, four, or more light sources, may be used. Of course, a single light source is acceptable. Further, the operator may set optical lenses, polarizing film, film to regulate the phase difference, or IR films, etc., suitably in the optical system.

As described above, the scope of application of the semiconductor device of the present invention is very wide, and the invention can be applied to electronic equipment of any field. The semiconductor device of Embodiment 21 can be realized even if any combination of Embodiments 1 to 20 is used.

It is possible to increase the reliability of n-channel type TFTs used in all semiconductor devices by implementing the present invention. As a result, semiconductor devices containing CMOS circuits manufactured by TFTs, specifically the pixel section and its peripheral drive circuits in a liquid crystal display device can have increased reliability. Therefore, the reliability is increased for electronic equipment in which semiconductor circuits, or the above liquid crystal display devices, which include n-channel TFT circuits, are incorporated as parts.

The element of the second gate electrode is conductive silicon film in the above Embodiments. However, it may be a metal element such as titanium (Ti), tantalum (Ta), tungsten (W), molybdenum (Mo) or their alloy for improving its heat resistance.

What is claimed is:

1. A semiconductor device comprising:
   a CMOS circuit comprising a thin film transistor over a substrate, the thin film transistor comprising:
      a semiconductor layer over the substrate;
      a gate electrode adjacent to the semiconductor layer with a gate insulating film interposed therebetween,
      wherein the gate electrode comprises a first conductive layer, a second conductive layer on the first conductive layer, a third conductive layer on the second conductive layer, and a fourth conductive layer covering the first through the third conductive layers.

2. A semiconductor device according to claim 1, wherein the first conductive layer comprises conductive silicon.

3. A semiconductor device according to claim 1, wherein the first conductive layer comprises titanium.

4. A semiconductor device according to claim 1, wherein the third conductive layer comprises titanium.

5. A semiconductor device according to claim 1, wherein the fourth conductive layer comprises conductive silicon.

6. A semiconductor device according to claim 1, wherein the gate electrode is formed over the semiconductor layer.

7. A semiconductor device according to claim 1, wherein the semiconductor device is incorporated in at least one selected from the group consisting of a cellular phone, a video camera, a mobile computer, a goggle-type display, a projector, a personal computer, an electronic game player, a digital camera, and a player which employs a recording medium.

8. A semiconductor device comprising:
   a CMOS circuit comprising a thin film transistor over a substrate, the thin film transistor comprising:
      a semiconductor layer over the substrate;
      a gate electrode adjacent to the semiconductor layer with a gate insulating film interposed therebetween,
      wherein the gate electrode comprises a first conductive layer, a second conductive layer comprising copper on the first conductive layer, a third conductive layer on the second conductive layer, and a fourth conductive layer covering the first through the third conductive layers.

9. A semiconductor device according to claim 8, wherein the first conductive layer comprises conductive silicon.

10. A semiconductor device according to claim 8, wherein the first conductive layer comprises titanium.

11. A semiconductor device according to claim 8, wherein the third conductive layer comprises titanium.

12. A semiconductor device according to claim 8, wherein the fourth conductive layer comprises conductive silicon.

13. A semiconductor device according to claim 8, wherein the gate electrode is formed over the semiconductor layer.

14. A semiconductor device according to claim 8, wherein the semiconductor device is incorporated in at least one selected from the group consisting of a cellular phone, a video camera, a mobile computer, a goggle-type display, a projector, a personal computer, an electronic game player, a digital camera, and a player which employs a recording medium.

15. A semiconductor device comprising:
   a CMOS circuit comprising a thin film transistor over a substrate, the thin film transistor comprising:
   a semiconductor layer over the substrate;
   a gate electrode adjacent to the semiconductor layer with a gate insulating film interposed therebetween,
   wherein the gate electrode comprises a first conductive layer, a second conductive layer comprising aluminum on the first conductive layer, a third conductive layer on the second conductive layer, and a fourth conductive layer covering the first through the third conductive layers.

16. A semiconductor device according to claim 15, wherein the first conductive layer comprises conductive silicon.

17. A semiconductor device according to claim 15, wherein the first conductive layer comprises titanium.

18. A semiconductor device according to claim 15, wherein the third conductive layer comprises titanium.

19. A semiconductor device according to claim 15, wherein the fourth conductive layer comprises conductive silicon.

20. A semiconductor device according to claim 15, wherein the gate electrode is formed over the semiconductor layer.

21. A semiconductor device according to claim 15, wherein the semiconductor device is incorporated in at least one selected from the group consisting of a cellular phone, a video camera, a mobile computer, a goggle-type display, a projector, a personal computer, an electronic game player, a digital camera, and a player which employs a recording medium.

22. A semiconductor device comprising:
   a pixel section comprising a thin film transistor over a substrate, the thin film transistor comprising:
   a semiconductor layer over the substrate;
   a gate electrode adjacent to the semiconductor layer with a gate insulating film interposed therebetween,
   wherein the gate electrode comprises a first conductive layer, a second conductive layer on the first conductive layer, a third conductive layer on the second conductive layer, and a fourth conductive layer covering the first through the third conductive layers.

23. A semiconductor device according to claim 22, wherein the first conductive layer comprises conductive silicon.

24. A semiconductor device according to claim 22, wherein the first conductive layer comprises titanium.

25. A semiconductor device according to claim 22, wherein the third conductive layer comprises titanium.

26. A semiconductor device according to claim 22, wherein the fourth conductive layer comprises conductive silicon.

27. A semiconductor device according to claim 22, wherein the gate electrode is formed over the semiconductor layer.

28. A semiconductor device according to claim 22, wherein the semiconductor device is incorporated in at least one selected from the group consisting of a cellular phone, a video camera, a mobile computer, a goggle-type display, a projector, a personal computer, an electronic game player, a digital camera, and a player which employs a recording medium.

29. A semiconductor device comprising:
   a pixel section comprising a thin film transistor over a substrate, the thin film transistor comprising:
   a semiconductor layer over the substrate;
   a gate electrode adjacent to the semiconductor layer with a gate insulating film interposed therebetween,
   wherein the gate electrode comprises a first conductive layer, a second conductive layer comprising copper on the first conductive layer, a third conductive layer on the second conductive layer, and a fourth conductive layer covering the first through the third conductive layers.

30. A semiconductor device according to claim 29, wherein the first conductive layer comprises conductive silicon.

31. A semiconductor device according to claim 29, wherein the first conductive layer comprises titanium.

32. A semiconductor device according to claim 29, wherein the third conductive layer comprises titanium.

33. A semiconductor device according to claim 29, wherein the fourth conductive layer comprises conductive silicon.

34. A semiconductor device according to claim 29, wherein the gate electrode is formed over the semiconductor layer.

35. A semiconductor device according to claim 29, wherein the semiconductor device is incorporated in at least one selected from the group consisting of a cellular phone, a video camera, a mobile computer, a goggle-type display, a projector, a personal computer, an electronic game player, a digital camera, and a player which employs a recording medium.

36. A semiconductor device comprising:
   a pixel section comprising a thin film transistor over a substrate, the thin film transistor comprising:
   a semiconductor layer over the substrate;
   a gate electrode adjacent to the semiconductor layer with a gate insulating film interposed therebetween,
   wherein the gate electrode comprises a first conductive layer, a second conductive layer comprising aluminum on the first conductive layer, a third conductive layer on the second conductive layer, and a fourth conductive layer covering the first through the third conductive layers.

37. A semiconductor device according to claim 36, wherein the first conductive layer comprises conductive silicon.

38. A semiconductor device according to claim 36, wherein the first conductive layer comprises titanium.

39. A semiconductor device according to claim 36, wherein the third conductive layer comprises titanium.

40. A semiconductor device according to claim 36, wherein the fourth conductive layer comprises conductive silicon.

41. A semiconductor device according to claim 36, wherein the gate electrode is formed over the semiconductor layer.

42. A semiconductor device according to claim 36, wherein the semiconductor device is incorporated in at least one selected from the group consisting of a cellular phone, a video camera, a mobile computer, a goggle-type display, a projector, a personal computer, an electronic game player, a digital camera, and a player which employs a recording medium.

* * * * *